United States Patent
Ashley et al.

(10) Patent No.: US 7,191,083 B2
(45) Date of Patent: *Mar. 13, 2007

(54) METHOD AND APPARATUS FOR CALIBRATING DATA-DEPENDENT NOISE PREDICTION

(75) Inventors: Jonathan J. Ashley, Los Gatos, CA (US); Heinrich J. Stockmanns, Santa Cruz, CA (US)

(73) Assignee: Infineon Technologies, AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/490,981

(22) Filed: Jul. 20, 2006

(65) Prior Publication Data

US 2006/0259263 A1     Nov. 16, 2006

Related U.S. Application Data

(60) Division of application No. 11/109,207, filed on Apr. 18, 2005, which is a continuation of application No. 10/402,033, filed on Mar. 28, 2003, now Pat. No. 6,889,154.

(60) Provisional application No. 60/373,877, filed on Apr. 18, 2002.

(51) Int. Cl.
*G01R 35/00* (2006.01)

(52) U.S. Cl. .................. 702/107; 702/85; 702/107; 702/190; 714/795; 714/799; 704/242; 375/262; 375/341; 360/46; 360/66

(58) Field of Classification Search .............. 702/85, 702/17, 190, 196–197, 107; 714/795, 799; 704/242; 375/262, 341; 360/46, 66
See application file for complete search history.

(56) References Cited

U.S. PATENT DOCUMENTS 5,003,617 A     3/1991 Epsom et al.

(Continued)

FOREIGN PATENT DOCUMENTS

DE     EP 0 871 170 A2     10/1998

OTHER PUBLICATIONS

Opencores.org, 2 pages, last modified Jun. 13, 2001.

(Continued)

*Primary Examiner*—Marc S. Hoff
*Assistant Examiner*—Elias Desta
(74) *Attorney, Agent, or Firm*—Brinks, Hofer, Gilson & Lione

(57) ABSTRACT

Disclosed herein is an apparatus and method of calibrating the parameters of a Viterbi detector 138 in which each branch metric is calculated based on noise statistics that depend on the signal hypothesis corresponding to the branch. An offline algorithm for calculating the parameters of data-dependent noise predictive filters 304A-D is presented which has two phases: a noise statistics estimation or training phase, and a filter calculation phase. During the training phase, products of pairs of noise samples are accumulated in order to estimate the noise correlations. Further, the results of the training phase are used to estimate how wide (in bits) the noise correlation accumulation registers need to be. The taps $[t_2^{[k]}, t_1^{[k]}, t_0^{[k]}]$ of each FIR filter are calculated based on estimates of the entries of a 3-by-3 conditional noise correlation matrix $C^{[k]}$ defined by $C_{ij}^{[k]} = E(n_{i-3}n_{j-3}|\text{NRZ condition } k)$.

20 Claims, 13 Drawing Sheets

U.S. PATENT DOCUMENTS

| | | | |
|---|---|---|---|
| 5,016,280 | A | 5/1991 | Engebretson et al. |
| 5,073,769 | A | 12/1991 | Kompelien |
| 5,257,182 | A | 10/1993 | Luck et al. |
| 5,513,215 | A | 4/1996 | Marchetto et al. |
| 5,581,581 | A | 12/1996 | Sato ........................... 375/341 |
| 5,625,505 | A | 4/1997 | Ohmori et al. ................ 360/46 |
| 5,644,603 | A | 7/1997 | Ushirokawa ................. 375/341 |
| 5,809,080 | A | 9/1998 | Karabed et al. ............. 375/263 |
| 6,148,043 | A | 11/2000 | Fujimoto ..................... 375/341 |
| 6,148,431 | A | 11/2000 | Lee et al. .................... 714/794 |
| 6,163,517 | A | 12/2000 | Kim et al. ................ 369/59.21 |
| 6,199,191 | B1 | 3/2001 | Iwata ........................... 714/795 |
| 6,201,839 | B1 | 3/2001 | Kavčić et al. ............... 375/341 |
| 6,219,387 | B1 | 4/2001 | Glover ........................ 375/341 |
| 6,278,568 | B1 | 8/2001 | Cloke et al. |
| 6,301,684 | B1 | 10/2001 | Watanabe et al. ........... 714/796 |
| 6,334,201 | B1 | 12/2001 | Sawaguchi et al. ......... 714/795 |
| 6,449,110 | B1 | 9/2002 | DeGroat et al. |
| 6,581,184 | B1 * | 6/2003 | Saeki et al. ................. 714/800 |
| 6,667,841 | B2 | 12/2003 | Taguchi et al. ............... 360/46 |
| 6,889,154 | B2 * | 5/2005 | Ashley et al. ............... 702/107 |

OTHER PUBLICATIONS

Chip Fleming, "A Tutorial on Convolutional Coding with Viterbi Decoding", updated Mar. 15, 2001, Copyright © 1999, 2000, 2001 Spectrum Applications.

Aleksandar Kavčić and José M. F. Moura, "Signal-Dependent Correlation-Sensitive Branch Metrics for Viterbi-like Sequence Detectors", Data Storage Systems Center, Carnegie Mellon University, Pittsburgh, PA, 0-7803-4788-9/98/$10.00 © 1998 IEEE, pp. 657-661.

Aleksandar Kavčić and José M. F. Moura, "Correlation-Sensitive Adaptive Sequence Detection", IEEE Transactions on Magnetics, vol. 34, No. 3, May 1998, pp. 763-770.

Charles W. Therrien, "Discrete Random Signals and Statistical Signal Processing", © 1992 by Prentice-Hall, Inc., ISBN 0-13-852112-3, chapters 7 & 8.

Paul H. Siegel, C. Bernard Shung, Thomas D. Howell, Hermant K. Thapar, IBM Corporation, San Jose, CA., "Exact Bounds for Viterbi Detector Path Metric Differences", Infineon Santa Cruz, Jun. 22, 2001, pp. 1-4.

Gerhard Fettweis, Heinrich Meyr, "A 100MBIT/S Viterbi Decoder Chip; Novel Architecture and its Realization", paper No. 257, session 307.4, Atlanta, GA, USA, Apr. 16-19 1990, pp. 1-5.

PCT International Search Report PCT/EP 03/03843.

Chen et al., "Convolutional Coding System with Tone Calibrated Technique for Land Mobile Radio Communication", Sep. 1990, IEEE Conference, pp. 73-76.

Acampora, "Bit Error Rate Bounds for Viterbi Decoding with Modem Implementation Errors", Jan. 1982, IEEE Article, pp. 129-134.

Doherty et al., 'An Adaptive Algorithm for Stable Decision-Feedback Filtering', Jan. 1993, IEEE Publication, vol. 40, No. 1, pp. 1-9.

Noriega et al., 'Adaptive Estimation of Noise Covariance Matrice in Real-Time Preprocessing of Geophysical Data', Sep. 1997, IEEE Publication, vol. 35, No. 5, pp. 1146-1159.

Herrick et al., 'Correlated Frequency Hopping; An Improved Approach to HF Spread Spectrum Communications', 1996, IEEE Publication, pp. 319-324.

Crosetto, 'Real-Time, Programmable, Digital Signal-Processing Electronics for Extracting the Information from a Detector Module for Multi-Modularity PET/SPECT/CT Scanners', Oct. 2000, IEEE Publication, vol. 2, pp. 69-76.

* cited by examiner

BMU for signal dependent noise

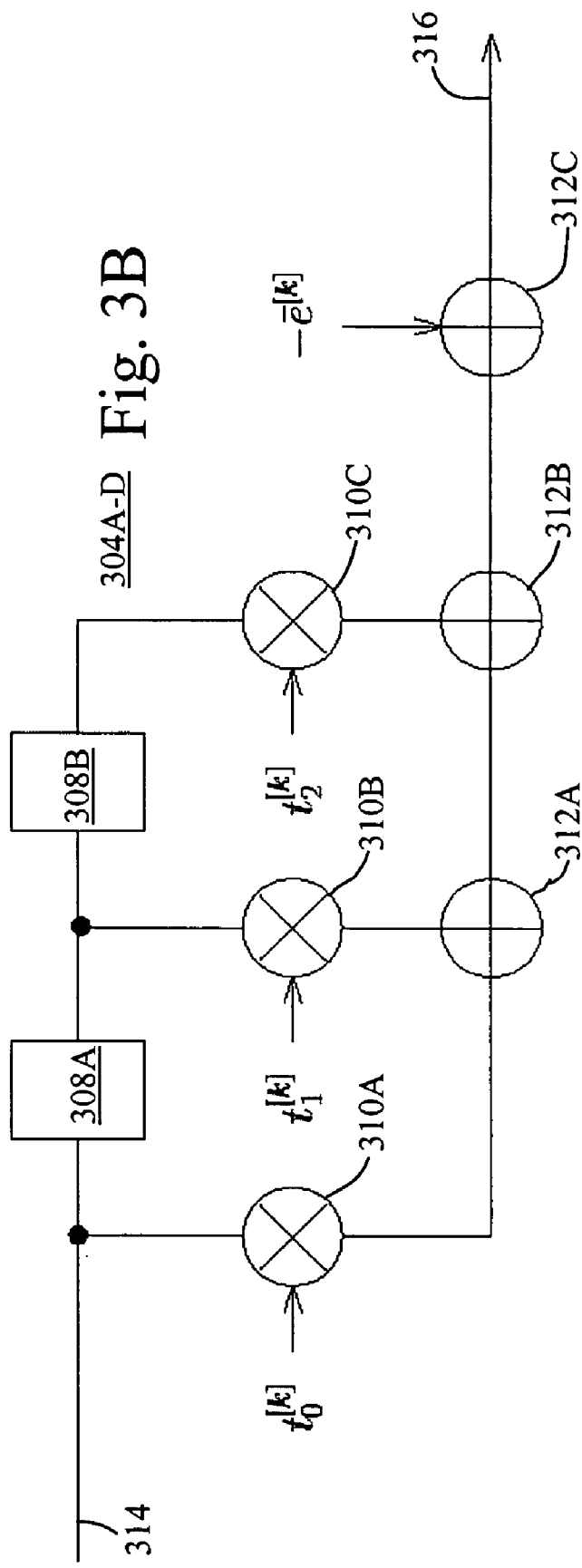
Fig. 3B Three tap FIR with filtered noise bias compensation

Maximum misprediction $m_0^2$

METHOD AND APPARATUS FOR CALIBRATING DATA-DEPENDENT NOISE PREDICTION

RELATED APPLICATIONS

This application is a divisional application under 37 C.F.R. § 1.53(b) of U.S. patent application Ser. No. 11/109,207 filed Apr. 18, 2005 (Infineon Ref. No. 2002P02124US02, BHGL Ref. No. 10808/241) which is a continuation of U.S. patent application Ser. No. 10/402,033 filed Mar. 28, 2003 (Infineon Ref No. 2002P02124US01, BHGL Ref. No. 10808/104) now U.S. Pat. No. 6,889,154, the entire disclosures of which are hereby incorporated by reference, which claims the benefit of the filing date pursuant to 35 U.S.C. § 119(e) of Provisional Application Ser. No. 60/373,877 (Attorney Docket No. 2002P02124US (BHGL Ref. No. 10808/11)), filed Apr. 18, 2002, the disclosure of which is hereby incorporated by reference.

U.S. patent application Ser. No. 10/402,033 incorporated by reference U.S. patent application Ser. No. 10/402,654 "METHOD AND APPARATUS FOR A DATA-DEPENDENT NOISE PREDICTIVE VITERBI", (Infineon Ref No. 2002P02130US01 (BHGL Ref. No. 10808/103)), filed Mar. 28, 2003, pending.

BACKGROUND

Computer hard disk drives, also known as fixed disk drives or hard drives, have become a de facto standard data storage component of modern computer systems and are making further inroads into modern consumer electronics. Their proliferation can be directly attributed to their low cost, high storage capacity and high reliability, wide availability, low power consumption, high data transfer speeds and decreasing physical size.

These disk drives typically consist of one or more rotating magnetic platters encased within an environmentally controlled housing that further includes all of the electronics and mechanics to read and write data and interface with other devices. Read/write heads are positioned above each of the platters, and typically on each face, to record and read data. The electronics of a hard disk drive are coupled with these read/write heads and include numerous components to control the position of the heads and generate or sense the electromagnetic fields representing data. These components receive data from a host device, such as a personal computer, and translate that data into magnetic encodings written onto the disk platters by the heads. Further, when a host device requests data from the drive, the electronics locates the desired data, senses the magnetic encodings which represent that data and translates those encodings back into the binary digital information which the host device can understand. Further, error detection and correction algorithms are applied to ensure accurate storage and retrieval of data.

One area in which significant advancements have been made has been in the area of read/write head technology and the methods of interpreting the magnetic fluctuations sensed by these heads. The read/write head, of which a typical hard disk has several, is the interface between magnetic platters and the disk drive electronics. The read/write head actually reads and writes the magnetically encoded data as areas of magnetic flux on the platters. Data, consisting of binary 1's and 0's, are encoded by sequences of the presence or absence of flux reversals recorded or detected by the read/write head. A flux reversal is a change in the magnetic flux in two contiguous areas of the disk platter. Traditional hard drives read data off the platters by detecting the voltage peak imparted in the read/write head when a flux reversal passes underneath the read/write head as the platters rotate. This is known as "peak detection." However, increasing storage densities require reduced peak amplitudes and better signal discrimination and higher platter rotational speeds are pushing the peaks closer together thus making peak detection more difficult to accomplish.

Magneto-resistive ("MR") read/write heads have been developed with increased sensitivity to sense smaller amplitude magnetic signals and with increased signal discrimination to address some of the problems with increasing storage density. In addition, another technology, known as Partial Response Maximum Likelihood ("PRML"), has been developed to further address the problems with peak detection as densities and rotational speeds increase. Borrowed from communications technology, PRML is an algorithm implemented in the disk drive electronics to interpret the magnetic signals sensed by the read/write heads. PRML-based disk drives read the analog waveforms generated by the magnetic flux reversals stored on the disk. However, instead of looking for peak values to indicate flux reversals, PRML-based drives digitally sample this analog waveform (the "Partial Response") and use advanced signal processing technologies to determine the bit pattern represented by that wave form (the "Maximum Likelihood"). This technology, in conjunction with magneto-resistive ("MR") heads, have permitted manufacturers to further increase data storage densities. PRML technology further tolerates more noise in the sensed magnetic signals permitting the use of lower quality platters and read/write heads which increases manufacturing yields and lowers costs.

With many different drives available from multiple manufacturers, hard disk drives are typically differentiated by factors such as cost/megabyte of storage, data transfer rate, power requirements and form factor (physical dimensions) with the bulk of competition based on cost. Most competition between hard disk drive manufacturers is coming in the area of cost, hence there is a need for enhanced hard disk drive components which prove cost effective in increasing supplies and driving down manufacturing costs all while increasing storage capacity, operating speed, reliability and power efficiency.

SUMMARY

The present invention is defined by the following claims, and nothing in this section should be taken as a limitation on those claims. The preferred embodiments described below relate to an apparatus for calibrating a Viterbi detector comprising at least one noise predictive filter. The apparatus includes a tap generator operative to generate at least one tap coefficient for the at least one noise predictive filter based on data samples obtained during off line training, the tap coefficient representative of a noise correlation estimate. The tap generator further comprising a tap calculator operative to compute the at least one tap coefficient based on a 3-by-3 conditional noise matrix $C_{[k]}$ defined by $C_{ij}^{[k]} = E(n_{i-3}n_{j-3} | \text{NRZ condition k})$.

The preferred embodiments further relate to a method of calibrating a Viterbi detector, the Viterbi detector comprising at least one noise predictive filter. In one embodiment, the method includes obtaining noise samples in a training phase, averaging the noise samples, estimating entries of a 3-by-3 conditional noise matrix $C^{[k]}$ defined by $C_{ij}^{[k]} = E(n_{i-3}n_{j-3}$ NRZ condition k), and calculating at least one tap of the at least one noise predictive filter based on the estimated entries.

Further aspects and advantages of the invention are discussed below in conjunction with the preferred embodiments.

BRIEF DESCRIPTION OF THE DRAWINGS

FIG. 3B depicts a block diagram of a FIR filter for use with the Viterbi detector of FIG. 2 according to one embodiment.

DETAILED DESCRIPTION OF THE PRESENTLY PREFERRED EMBODIMENTS

The embodiments described herein relate to a PRML-based read/write channel device for hard disk drive controllers. The read/write channel is a device coupled with the read/write heads of the hard disk drive. Herein, the phrase "coupled with" is defined to mean directly connected to or indirectly connected with through one or more intermediate components. Such intermediate components may include both hardware and software based components. The read/write channel converts binary/digital data from the host device into the electrical impulses which drive the read/write head to magnetically record the data to the disk drive platters. Further, the read/write channel receives the analog waveform magnetically sensed by the read/write heads and converts that waveform back into the binary/digital data stored on the drive.

Figure 1:
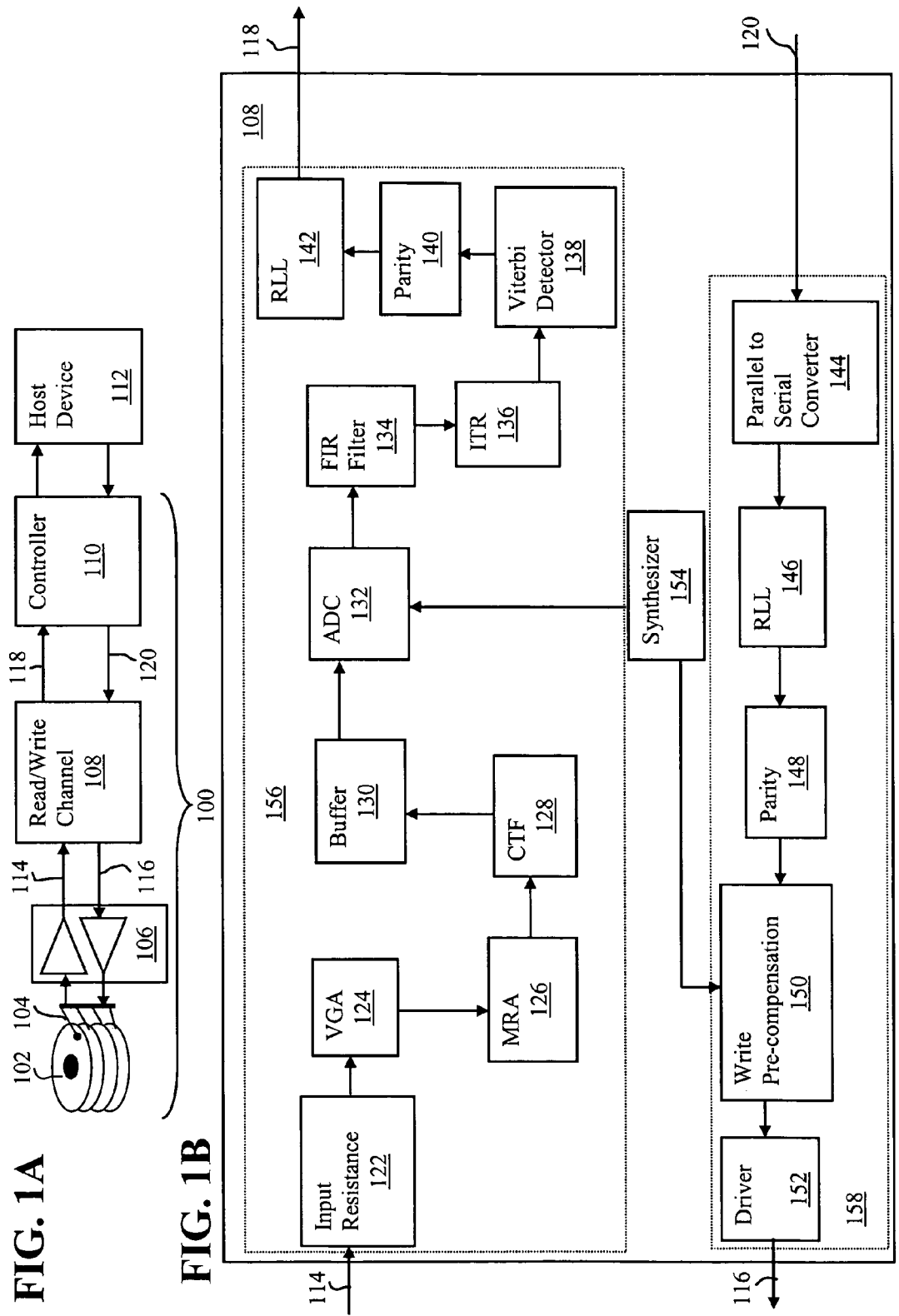
FIG. 1A depicts block diagram of an exemplary hard disk drive coupled with a host device.
FIG. 1B depicts a block diagram of read/write channel for use with the disk drive of FIG. 1A.

Referring to FIG. 1A, there is shown a block diagram of an exemplary hard disk drive 100 coupled with a host device 112. For clarity, some components, such as the servo/actuator motor control, are not shown. The drive 100 includes the magnetic platters and spindle motor 102, the read/write heads and actuator assembly 104, pre-amplifiers 106, a read/write channel 108 and a controller 110. The pre-amplifiers 106 are coupled with the read/write channel 108 via interfaces 114, 116. The controller 110 interfaces with the read/write channel 108 via interfaces 118, 120.

For reads from the hard disk 100, the host device 112 provides a location identifier which identifies the location of the data on the disk drive, e.g. a cylinder and sector address. The controller 110 receives this address and determines the physical location of the data on the platters 102. The controller 110 then moves the read/write heads into the proper position for the data to spin underneath the read/write heads 104. As the data spins underneath the read/write head 104, the read/write head 104 senses the presence or absence of flux reversals, generating a stream of analog signal data. This data is passed to the pre-amplifiers 106 which amplifies the signal and passes it to the read/write channel 108 via the interface 114. As will be discussed below, the read/write channel receives the amplified analog waveform from the pre-amplifiers 106 and decodes this waveform into the digital binary data that it represents. This digital binary data is then passed to the controller 110 via the interface 118. The controller 110 interfaces the hard drive 100 with the host device 112 and may contain additional functionality, such as caching or error detection/correction functionality, intended to increase the operating speed and/or reliability of the hard drive 100.

For write operations, the host device 112 provides the controller 110 with the binary digital data to be written and the location, e.g. cylinder and sector address, of where to write it. The controller 110 moves the read/write heads 104 to the proper location and sends the binary digital data to be written to the read/write channel 108 via interface 120. The read/write channel 108 receives the binary digital data, encodes it and generates analog signals which are used to drive the read/write head 104 to impart the proper magnetic flux reversals onto the magnetic platters 102 representing the binary digital data. The generated signals are passed to the pre-amplifiers 106 via interface 116 which drive the read/write heads 104.

Referring to FIG. 1B, there is shown an exemplary read/write channel 108 supporting Partial Response Maximum Likelihood ("PRML") encoding technology for use with the hard disk drive 100 of FIG. 1A. For clarity, some components have been omitted. The read/write channel 108 is implemented as an integrated circuit using a complementary metal oxide semiconductor ("CMOS") process at 0.18 micron. It will be appreciated that CMOS processes include processes which use metal gates as well as polysilicon gates. It will further be appreciated that other process technologies and feature sizes may used and that the circuitry disclosed herein may be further integrated with other circuitry comprising the hard disk electronics such as the hard disk controller logic. As was described, the read/write channel 108 converts between binary digital information and the analog signals representing the magnetic flux on the platters 102. The read/write channel 108 is divided into two main sections, the read path 156 and the write path 158.

The write path 158 includes a parallel-to-serial converter 144, a run-length-limited ("RLL") encoder 146, a parity encoder 148, a write pre-compensation circuit 150 and a driver circuit 152. The parallel-to-serial converter 144 receives data from the host device 112 via interface 120 eight bits at a time. The converter 144 serializes the input data and sends the serial bit stream to the RLL encoder 146. The RLL encoder 146 encodes the serial bit stream into symbolic binary sequences according to a known run-length limited algorithm for recording on the platters 102. The exemplary RLL encoder uses a 32/33 bit symbol code to ensure that flux reversals are properly spaced and that long runs of data without flux reversals are not recorded. The RLL encoded data is then passed to the parity encoder 148 which adds a parity bit to the data. In the exemplary parity encoder 148, odd parity is used to ensure that long run's of 0's and 1's are not recorded due to the magnetic properties of such recorded data. The parity encoded data is subsequently treated as an analog signal rather than a digital signal. The analog signal is passed to a write pre-compensation circuit 150 which dynamically adjusts the pulse widths of the bit stream to account for magnetic distortions in the recording process. The adjusted analog signal is passed to a driver circuit 152 which drives the signal to the pre-amplifiers 106 via interface 116 to drive the read/write heads 104 and record the data. The exemplary driver circuit 152 includes a pseudo emitter coupled logic ("PECL") driver circuit which generates a differential output to the pre-amplifiers 106.

The read path 156 includes an attenuation circuit/input resistance 122, a variable gain amplifier ("VGA") 124, a magneto-resistive asymmetry linearizer ("MRA") 126, a continuous time filter ("CTF") 128, a buffer 130, an analog to digital converter ("ADC") 132, a finite impulse response ("FIR") filter 134, an interpolated timing recovery ("ITR") circuit 136, a Viterbi algorithm detector 138, a parity decoder 140 and a run-length-limited ("RLL") decoder 142. The amplified magnetic signals sensed from the platters 102 by the read/write head 104 are received by the read/write channel 108 via interface 114. The analog signal waveform representing the sensed magnetic signals is first passed through an input resistance 122 which is a switching circuit to attenuate the signal and account for any input resistance. The attenuated signal is then passed to a VGA 124 which amplifies the signal. The amplified signal is then passed to the MRA 126 which adjusts the signal for any distortion created by the recording process. Essentially, the MRA 126 performs the opposite function of the write-pre-compensation circuit 150 in the write path 158. The signal is next passed through the CTF 128, which is essentially a low pass filter, to filter out noise. The filtered signal is then passed to the ADC 132 via the buffer 130 which samples the analog signal and converts it to a digital form. The digital signal is then passed to a FIR filter 134 and then to a timing recovery circuit 136. The timing recovery circuit 136 is connected (not shown in the figure) to the FIR filter 134, the MRA 126 and the VGA 124 in a feedback orientation to adjust these circuits according to the signals received to provide timing compensation. The exemplary FIR filter 134 is a 10 tap FIR filter. The digital signal is then passed to the Viterbi algorithm detector 138 which determines the binary bit pattern represented by the digital signal using digital signal processing techniques. The exemplary Viterbi algorithm detector 138 uses a 32 state Viterbi processor. The binary data represented by the digital signal is then passed to the parity decoder 140 which removes the parity bit and then to the RLL decoder 142 which decodes the binary RLL encoding symbols back into the actual binary data that they represents This data is then passed to the controller 110 via the interface 118.

The read/write channel 108 further includes a clock synthesizer 154. The clock synthesizer 154 generates the clock signals required for operating the read/write channel 108. The exemplary clock synthesizer 154 includes a phased lock loop ("PLL") (not shown) with a voltage controlled oscillator and various clock dividers to generate the necessary frequencies.

Figure 2:
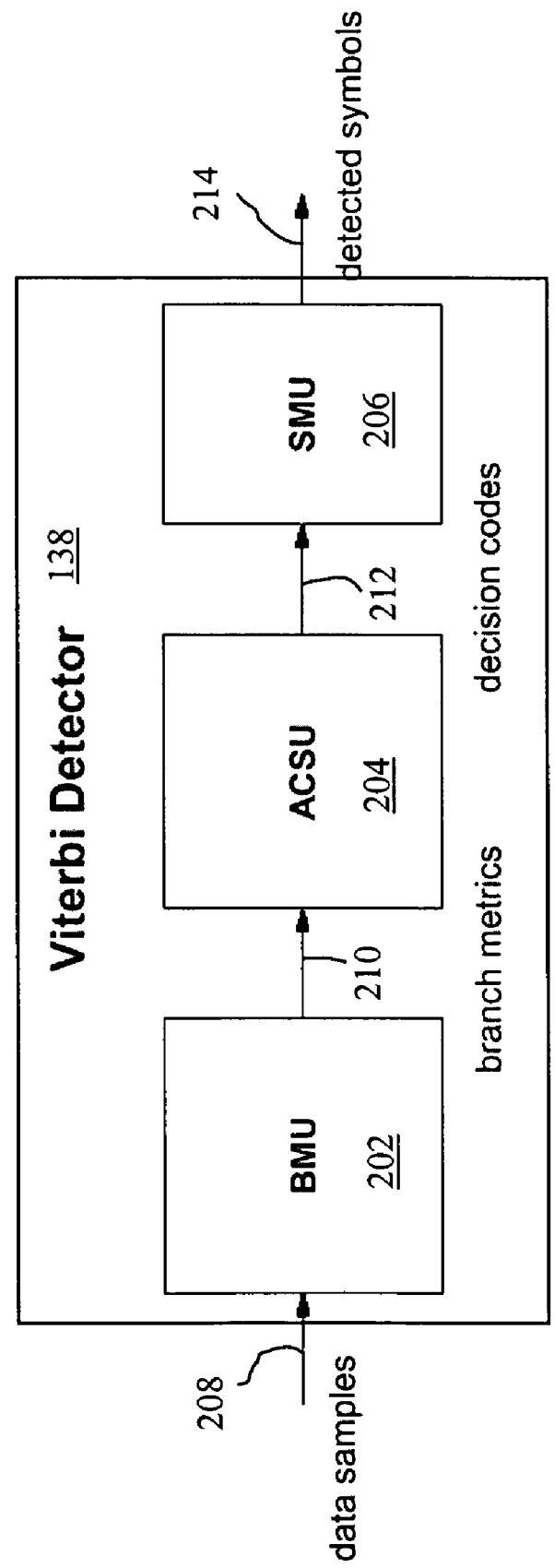
FIG. 2 depicts a block diagram of an exemplary Viterbi detector according to one embodiment.

In accordance with one preferred embodiment, a method and apparatus for calibrating a noise predictive Viterbi detector 138 is described. The Viterbi detector 138 is a maximum likelihood detector or Viterbi decoder implementing the Viterbi algorithm for analyzing the partial response signal provided by the discrete, equalized signal of the FIR filter 134 and the ITR circuit 136, as illustrated in FIGS. 1B and 2. The Viterbi detector 138 generates a digital binary data output signal in response, which is received by the parity decoder 140. In performing maximum likelihood detection, the Viterbi algorithm provides an iterative method for determining the best path along branches of a trellis diagram. The maximum likelihood detection involves analyzing a number of consecutive data samples to determine the most likely path. Thus, by analyzing a number of consecutive samples, the most likely sequence can be chosen. The Viterbi detector 138 implements a predetermined trellis diagram by having a given number of states, wherein for each state, the Viterbi detector 138 determines a branch metric value for each branch entering the state, a state metric value, and a survivor branch. In order to accomplish this task, the Viterbi detector 138 includes a branch metric unit (BMU) 202, an add-compare-select unit (ACSU) 204, and a survivor memory unit (SMU) 206, as illustrated in FIG. 2. An example of one implementation of a Viterbi detector is described in greater detail in a paper entitled "A 100 MBIT/S Viterbi Detector Chip: Novel Architecture And Its Realization," written by Gerhard Fettweis and Heinrich Meyr, presented to the ICC in 1990, in Atlanta, Ga., on Apr. 16–19, 1990, given paper no. 257, at session 307A, the entire disclosure of which is incorporated herein by reference.

For simplicity, the following description of the Viterbi detector 138 will be limited to describing only one state, even though the Viterbi detector 138 may have more than one state, as known by those skilled in the art. In one preferred embodiment, the Viterbi detector is a 32 state detector wherein each state comprises 4 bits.

During a read cycle, the branch metric unit 202 receives a stream of binary digital data 208 from the FIR filter 134 and the ITR circuit 136, determines a branch metric value (Q) for each state at a time k+1, and outputs the branch metric value (Q) for time k+1 within a branch metric signal 210. The branch metric signal 210 includes the branch metric value (Q) for each discrete, equalized value of the binary data 208. The branch metric value (Q) is provided in a binary representation, and has a length of (g) bits. The branch metric value (Q) may be calculated using any one of a number of algorithms commonly used for calculating branch metric values.

The branch metric signal 202 containing the branch metric value (Q) for time k+1 is then input into the ACSU 204 along with a state metric signal (not shown) containing a state metric value (M) for time k. The ACSU 204 includes an adding unit, a comparator, a selector, and a latch, all not shown. At any time k, the state metric value (M) indicates a cost associated with the best path through the trellis diagram to the state, and is therefore a measure for the likelihood of this particular path. Preferably, the state metric value (M) is stored in a memory device, such as the latch (not shown). If a latch is used to store the state metric value (M), the latch must be able to store g+h binary bits.

The adding unit of the ACSU, details not shown in figures, adds the branch metric value (Q) for time k+1 for a given state to the state metric value (M) for time k for a given state to obtain a state metric value (M) for time k+1 for a given state. The state metric value (M) for time k is stored in the latch in the ACSU 204, and received by adding unit. The adding unit outputs the state metric value (M) for time k+1 for a given state to the comparator and the selector. Typically, more than one state metric value (M) for time k+1 exists for any given state, and all these value are output by the adding unit 200. The comparator receives the output of the adding unit containing all the state metric values (M) for time k+1 for a given state and then compares all the state metric values (M) for time k+1 for the given state. The comparator then generates a control input for the selector. Additionally, the comparator outputs a control signal which is received by the SMU 206. The selector receives the control input from the comparator and the output from the adding unit containing all the state metric values (M) for time k+1 for a given state, and selects a state metric value (M) for time k+1, which is then stored in the latch. Preferably, the selector selects the largest state metric value (M) for time k+1 for a given state, and outputs that value to the latch.

The survivor memory unit (SMU) 206 receives and processes the control signal 212 from the ACSU 204, and more particularly from the comparator in the ACSU 234. The SMU 206 processes the signal received from the ACSU 204, and generates a digital binary data output signal in response which is received by the parity decoder 140, as illustrated in FIG. 1B. For more detail, refer to U.S. patent application Ser. No. 09/896,134, entitled "METHOD AND APPARATUS FOR VITERBI DETECTOR STATE METRIC RE-NORMALIZATION", filed Jun. 29, 2001, and incorporated by reference herein.

Disclosed herein is a method of calibrating the parameters of a Viterbi detector 138 in which each branch metric is calculated based on noise statistics that depend on the signal hypothesis corresponding to the branch. For more detail, refer to the above captioned patent application entitled "METHOD AND APPARATUS FOR A DATA-DEPENDENT NOISE PREDICTIVE VITERBI", herein incorporated by reference. While the disclosed embodiments are discussed in relation to Viterbi detectors used in hard disk read channels, it will be appreciated that the disclosed embodiments may also be used with Viterbi detectors utilized for other purposes such as other recording or communications technologies.

The Viterbi detection algorithm for estimating the transmitted signal in noisy received data is well known. The algorithm uses dynamic programming to compute the maximum likelihood estimate of the transmitted signal from the received data, where the likelihood is computed assuming a particular model of the noise statistics in the received data.

In prior Viterbi detectors, the maximum likelihood estimate of transmitted data is computed assuming that the noise is stationary. In particular, it is assumed that the noise is independent of the transmitted signal. This assumption allows a simplified detector, but with stronger correlations between noise and the transmitted signal, the simplified detector's performance increasingly falls below true maximum likelihood performance.

In recording technologies as practiced today, physical imperfections in the representation of recorded user data in the recording medium itself are becoming the dominate source of noise in the read back data. This noise is highly dependent on what was (intended to be) written in the medium. Prior Viterbi detectors, that assume a stationary noise model, cannot exploit this statistical dependence of the noise on the signal.

Figure 3A:
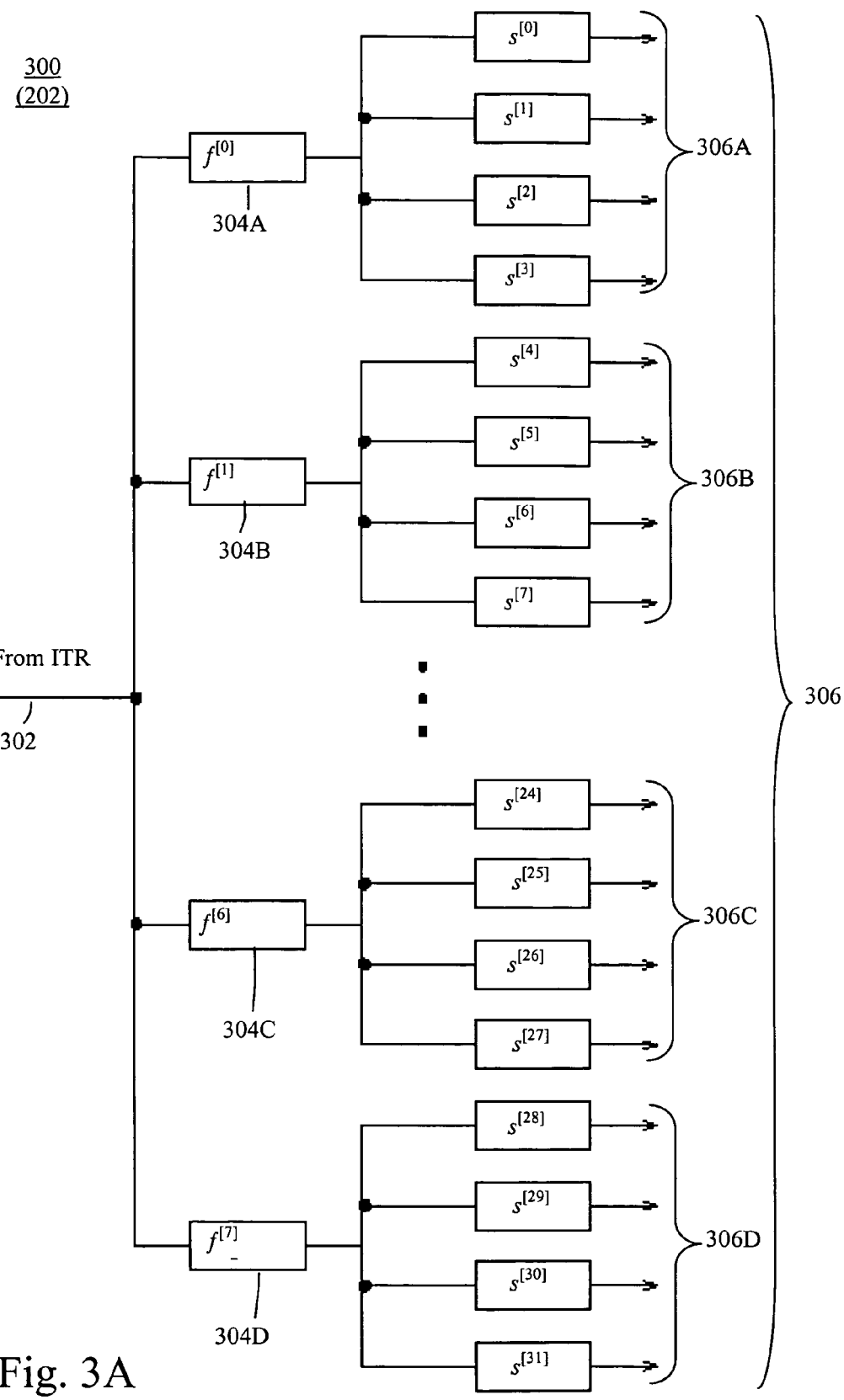
FIG. 3A depicts a block diagram of a Branch Metric Unit for use with the Viterbi detector of FIG. 2 according to one embodiment.

An exemplary architecture 300 for a branch metric unit 202 for use with a noise predictive Viterbi detector is shown in FIG. 3A. A feature of this architecture 300 is that the branch metrics 306 (and their corresponding square difference operators) are clustered into multiple groups 306A–D, where all the members of each group draw input from a single, shared noise predictive filter 304A–D corresponding to the group. In the case illustrated, the 32 branch metrics 306 are divided into eight groups, four of which 306A–D are shown, each group having four members. For more detail, refer to the above captioned patent application "METHOD AND APPARATUS FOR A DATA-DEPENDENT NOISE PREDICTIVE VITERBI".

An exemplary three tap 310A–C FIR filter 304A–D for use with the branch metric unit 202 of FIG. 3A is shown in FIG. 3B. The FIR filter 304A–D is designed to filter out as much noise from the signal as possible prior to Viterbi processing where the detector tries to figure out what the signal is. The problem is that noise is generally unpredictable as it comes from many different factors. The unpredictable nature of noise makes it difficult to separate the noise from the signal. Typical FIR filters strike a balance between filtering as much noise as possible and ensuring that only a minimal amount of the signal is lost in the process. If the noise being looked for can be predicted, it becomes easier to more accurately separate and remove that noise from the signal without compromising the signal.

1 Overview

An algorithm for calculating the parameters, such as optimized filter coefficients, of data-dependent noise predictive filters 304A–D is presented. The algorithm has two phases: a noise statistics estimation or training phase and a filter calculation phase. The training phase is typically performed using hardware built into the read channel device 108, as will be described below. Alternatively, training may be performed using off-chip hardware and/or software or a combination of off-chip and on-chip hardware and/or software. During the training phase, products of pairs of noise samples are accumulated in order to estimate the noise correlations. During this phase, the read channel device 108 acts as a noise statistic measurement tool which acquires noise statistics while reading back "known" data from the disk drive 100 as would be done during normal operation. These noise statistic measurements are then provided to external hardware and/or software to perform the calculation phase of the disclosed calibration method, as described below. Typically, the read channel device 108 is instructed by an external device to perform such measurements. In one embodiment, the hard disk drive 100 including the read channel device 108 further includes a micro-controller 110 which, in addition to the hardware and/or software/firmware to operate the drive 100, includes hardware and/or software/firmware to calibrate the read channel device 108 as described. The micro-controller 110 controls the read channel device 108 to acquire the necessary statistic samples and perform the calculations as described below. In an alternate embodiment, the read channel device 108 itself contains the hardware and/or software necessary to perform self-calibration.

The calculation phase is typically performed off-chip, i.e. not on the read channel device 108, and is described in below. The calculation phase may be performed by any device capable of performing the requisite computations and capable of interfacing with the read channel device 108 to receive the measured noise statistics and provide the computed Viterbi parameters. In one embodiment, as described above, the calculation phase is performed by the micro-controller 110 of the hard disk drive 100 which includes the read channel device 108.

Further, calibration, including both the training and calculation phases, is typically performed during manufacturing of the device, such as a hard disk drive 100, which will include the read channel device 108. During manufacture of a particular hard disk drive 100, the optimal parameters for the noise predictive Viterbi detector of that drive are determined, as disclosed. Once these parameters are determined, they are stored in the drive 100 in some form of non-volatile storage which permits the parameters to be downloaded into the read channel device 108 during operation. In one alternative device, the read channel device 108 itself provides non-volatile storage to store these parameters. In yet another alternative device, hardware to support both the training and calculation phases for calibration is provided to permit calibration in the field, periodic re-calibration of an installed device and/or real time adaptive calibration.

The question of how much training is enough is also considered below. Further, the results of the training phase are used to estimate how wide (in bits) the noise correlation accumulation registers need to be. Finally, a minimal implementation to support the calibration algorithm for the read channel device 108 of FIG. 1B is presented.

2 Calculating the Taps

In a noise-predictive version of a FIR filter, each branch metric is the sum of two squared noise sample estimates: the earlier, and the later. Each noise sample is the difference between the output of a noise-predictive FIR and an expected ideal output. The taps $[t_2^{[k]}, t_1^{[k]}, t_0^{[k]}]$ of each FIR are calculated based on estimates of the entries of a 3-by-3 conditional noise correlation matrix $C^{[k]}$ defined by:

$$C_{ij}^{[k]} = E\ (n_{i-3}n_{j-3}|\text{NRZ condition k})$$

Here, the Non-Return to Zero ("NRZ") bit string $b_{1-q} \ldots b_{-1}b_0$ forming the data hypothesis is indexed by $k=b_{1-q}+2b_{2-q}+\ldots+2^{q-1}b_0$. The final bit $b_0$ of the hypothesis is the last NRZ bit on which the expected ideal FIR signal output depends.

The taps for the noise-predictive filter conditioned on k are given, up to a scalar multiple, by the solution $u^{[k]}$ to the two equations $$C^{[k]}u^{[k]} = \begin{bmatrix} 0 \\ 0 \\ \alpha \end{bmatrix} \quad (1)$$

and $$(u^{[k]})^T C^{[k]} u^{[k]} = 1, \quad (2)$$

where $\alpha>0$ is determined shortly.

The notation $u^{[k]}$ is used for the tap weight vector rather than the $t_i^{[k]}$ notation we used in the description of the online algorithm. There are two reasons for this change. First, $u^{[k]}$ is the ideal (real-valued) solution to the equations. It has not been scaled or quantized as the actual taps are. Second, the order of the indices is reversed: $u_i^{[k]}$ corresponds to $t_{3-i}^{[k]}$ The solution $u^{[k]}$ is given by the formula $$u^{[k]} = \frac{1}{\sqrt{\Delta \cdot x33}} \begin{bmatrix} x31 \\ x32 \\ x33 \end{bmatrix}, \quad (3)$$

where $\Delta=\det(C^{[k]})$ and $x_{ij}$ is the ij-th cofactor of the matrix $C^{[k]}$, specifically, $$x31 = \begin{vmatrix} c_{12} & c_{13} \\ c_{22} & c_{23} \end{vmatrix}$$

$$x32 = -\begin{vmatrix} c_{11} & c_{13} \\ c_{21} & c_{23} \end{vmatrix}$$

$$x33 = \begin{vmatrix} c_{11} & c_{12} \\ c_{21} & c_{22} \end{vmatrix}$$

It follows that $\alpha=\sqrt{\Delta/x33}$

3 Mow Much Training?

Mis-prediction

The accuracy of the noise prediction done under data condition k depends on the accuracy of the calculation of the tap vector $u^{[k]}$, which in turn depends on the accuracy of the training estimate of the conditional noise correlation matrix $C^{[k]}$. Roughly speaking, the more samples averaged to estimate $C^{[k]}$, the more accurate the noise prediction based on this estimate will be. The discussion below quantifies this statement.

Let $\hat{C}^{[k]}$ be the empirical estimate of $C^{[k]}$ calculated by averaging N (what is assumed to be independent) samples of each random noise product $n_{i-3}n_{j-3}$. Let $\hat{u}^{[k]}$ be the corresponding solution to equations 1 and 2. Then the expected square of the difference between 1. the predicted noise using $\hat{u}^{[k]}$, and
2. the predicted noise using the ideal taps $u^{[k]}$ is $$m=(\hat{u}^{[k]}-u^{[k]})^T C^{[k]} (\hat{u}^{[k]}-u^{[k]})$$

This formula is re-casted in terms of the covariance of the random vector $\hat{u}^{[k]}$. Spectrally decompose the positive definite matrix $C^{[k]}$ as $$C^{[k]} = \sum_l \lambda_l\ \epsilon_l\ \epsilon_l^T,$$

where $\epsilon_l$ is the right eigenvector of $C^{[k]}$ for eigenvalue $\lambda_l>0$. Then $$m^2 = \sum_l \lambda_l (\hat{u}^{[k]} - u^{[k]})^T \epsilon_l\ \epsilon_l^T (\hat{u}^{[k]} - u^{[k]})$$

$$= \sum_l \lambda_l\ \epsilon_l^T (\hat{u}^{[k]} - u^{[k]})(\hat{u}^{[k]} - u^{[k]})^T \epsilon_l.$$

Now $\hat{u}^{[k]}$ is a random variable we are using to estimate $u^{[k]}$. Define $$U=E_{\text{off}}((\hat{u}^{[k]}-u^{[k]})(\hat{u}^{[k]}-u^{[k]})^T)$$

where the notation off to the expectation operator is added to emphasize that the expectation is taken over the ensemble of random (offline) training sessions. Then the expression for the expected square prediction error becomes $$E_{\text{off}}(m^2) = \sum_l \lambda_l\ \epsilon_l^T\ U\ \epsilon_l.$$

One could estimate U directly, running the training algorithm many times, each time estimating $C^{[k]}$ using an average of many noise product samples. To save simulation time, an estimate of U is calculated indirectly based on (a much smaller number of) simulations. Here is the method. Denote the entries of $\hat{C}^{[k]}$ by $\hat{c}_{ij}$. Then $\hat{u}^{[k]}$ is calculated based on the random vector $$\gamma=[\hat{c}_{11}, \hat{c}_{22}, \hat{c}_{33}, \hat{c}_{12}, \hat{c}_{23}, \hat{c}_{13}]$$

By accumulating the products $(n_{3-i}n_{3-j})(n_{3-k}n_{3-l})$ during simulation, the 6-by-6 matrix $\Gamma$ of expectations $E_{\text{off}}(\hat{c}_{ij}-c_{ij})(\hat{c}_{kl}-c_{kl})$ can be estimated. By approximating the function $u:R^6 \to R^3$ defined by equation 3 above (that maps the six correlation estimates $\hat{c}_{ij}$ to the corresponding tap vector $\hat{u}^{[k]}$)

by the first order Taylor expansion based at the vector $\gamma_0$ corresponding to $C^{[k]}$, the approximation $$U \approx (\partial u/\partial \gamma)^T \Gamma (\partial u/\partial \gamma)$$

is determined where $\partial u/\partial \gamma$ is the 6-by-3 matrix of partial derivatives $\partial u_i^{[k]}/\partial c_{kl}$ evaluated at the point $\gamma_0$.

Now how $E_{off}(m^2)$ depends on the number N of samples used for training is analyzed. One will recall that $\hat{c}_{ij}$ is the average of N samples from the random variable $\tilde{c}_{ij} = n_{3-i} n_{3-j}$ having mean $c_{ij}$. Assuming these samples are independent, it is determined that $$E_{off}(\hat{c}_{ij} - c_{ij})(\hat{c}_{kl} - c_{kl}) = \frac{1}{N} E_{off}(\tilde{c}_{ij} - c_{ij})(\tilde{c}_{kl} - c_{kl})$$

So defining $\Gamma_0$ to be the 6-by-6 matrix with entries $E_{off}(\tilde{c}_{ij} - c_{ij})(\tilde{c}_{kl} - c_{kl})$, then $\Gamma = (1/N)\Gamma_0$. Setting $$U_0 = (\partial u/\partial \gamma)^T \Gamma_0 (\partial u/\partial \gamma)$$

then $U \approx (1/N)U_0$, and defining $m_0$ by $$m_0^2 = \sum_l \lambda_l \in_l^T U_0 \in_l,$$

then $$E_{off} m^2 \approx m_0^2/N$$

$$= \frac{1}{N} \sum_l \lambda_l \in_l^T \left(\frac{\partial u}{\partial \gamma}\right)^T \Gamma_0 \left(\frac{\partial u}{\partial \gamma}\right) \in_l$$

Both $\Gamma_0$ and $C^{[k]}$ can be accurately estimated with a few thousand noise samples. The spectral decomposition of $C^{[k]}$ can then be calculated and used along with the estimate of $\Gamma_0$ to calculate $m_0^2$.

Finally, the expected square noise at the square noise output $s^{[k]}$ of what we called a "square difference operator" in the description of the online detection algorithm is shown to be $1 + m_0^2/N$. Ideally, the expected square should be 1, so it seems reasonable to measure the expected dB cost in Signal-to-Noise-Ratio ("SNR") due to mis-prediction as $10 \log_{10}(1 + m_0^2/N)$.

The online expectation (due to runtime noise) of $s^{[k]}$, where $s^{[k]}$ is calculated using the taps $\hat{u}6[k]$, is $E_{on}(s^{[k]}) = (\hat{u}^{[k]})^T C^{[k]} \hat{u}^{[k]}$. So $$E_{off} E_{on} s^{[k]} = E_{off} (\hat{u}^{[k]})^T C^{[k]} \hat{u}^{[k]}$$

$$= E_{off} \sum_l \lambda_l \in_l^T \hat{u}^{[k]}(\hat{u}^{[k]})^T \in_l$$

$$= \sum_l \lambda_l \in_l^T E_{off}(\hat{u}^{[k]}(\hat{u}^{[k]})^T) \in_l,$$

Decomposing $\hat{u}^{[k]} = (\hat{u}^{[k]} - {}^{[k]}) + u^{[k]}$, and assuming $E_{off} \hat{u}^{[k]} = u^{[k]}$, the product $\hat{u}^{[k]}(\hat{u}^{[k]})^T$ is broken up into four terms, so that the above expression becomes $$E_{off} E_{on} s^{[k]} = \sum_l \lambda_l \in_l^T \left(U + 0 + 0 + u^{[k]}(u^{[k]})^T\right) \in_l$$

-continued $$= \left(\sum_l \lambda_l \in_l^T U \in_l\right) + (u^{[k]})^T C^{[k]} u^{[k]}$$

$$= E_{off} m^2 + 1$$

$$\approx (m_0^2/N) + 1,$$

as was desired to show.

Figure 4:
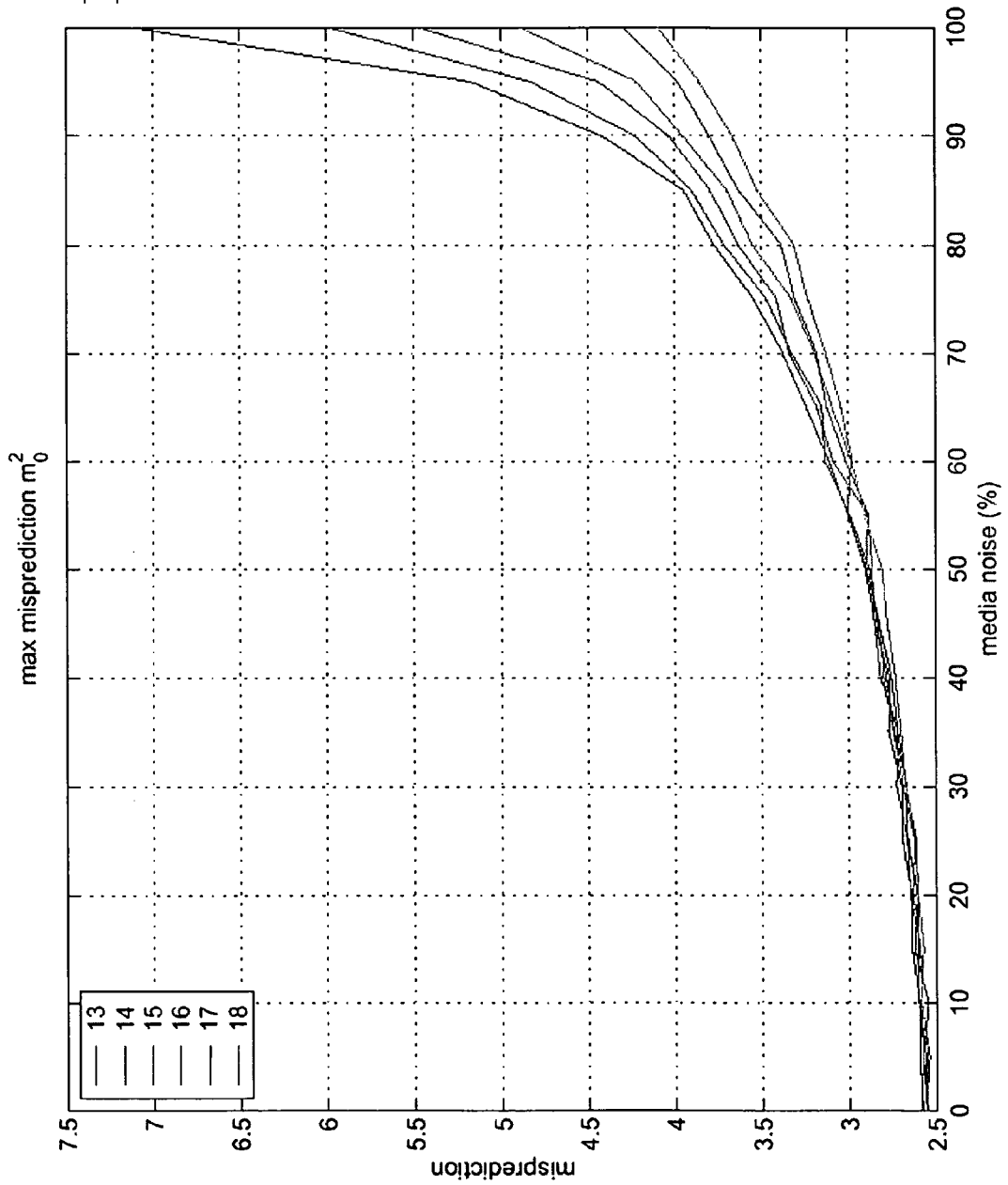
FIG. 4 depicts an exemplary graph showing maximum mis-prediction of the Viterbi detector of FIG. 2 according to one embodiment.
Figure 5:
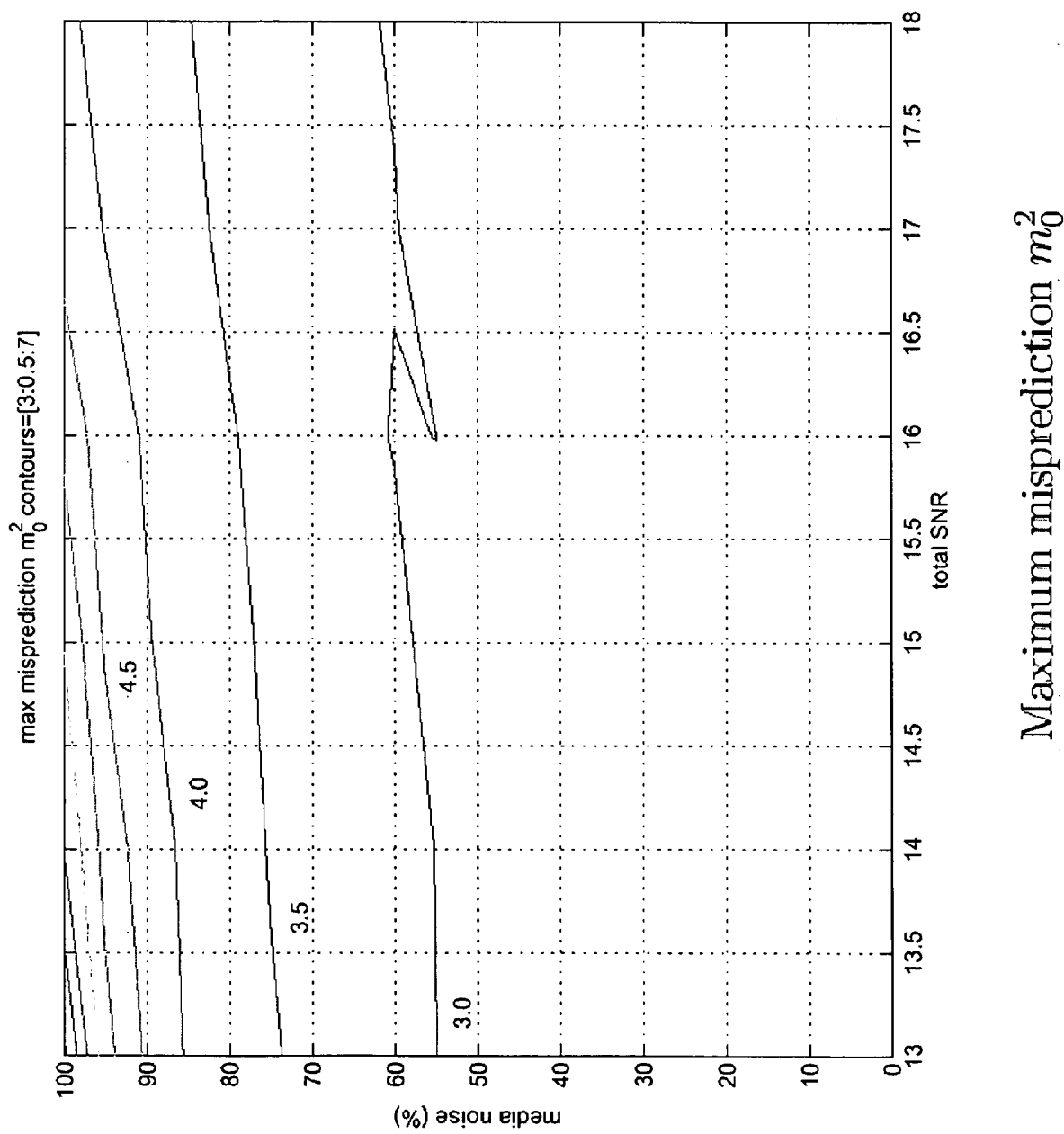
FIG. 5 depicts an exemplary graph showing maximum mis-prediction of FIG. 4 as a contour plot.
Figure 6:
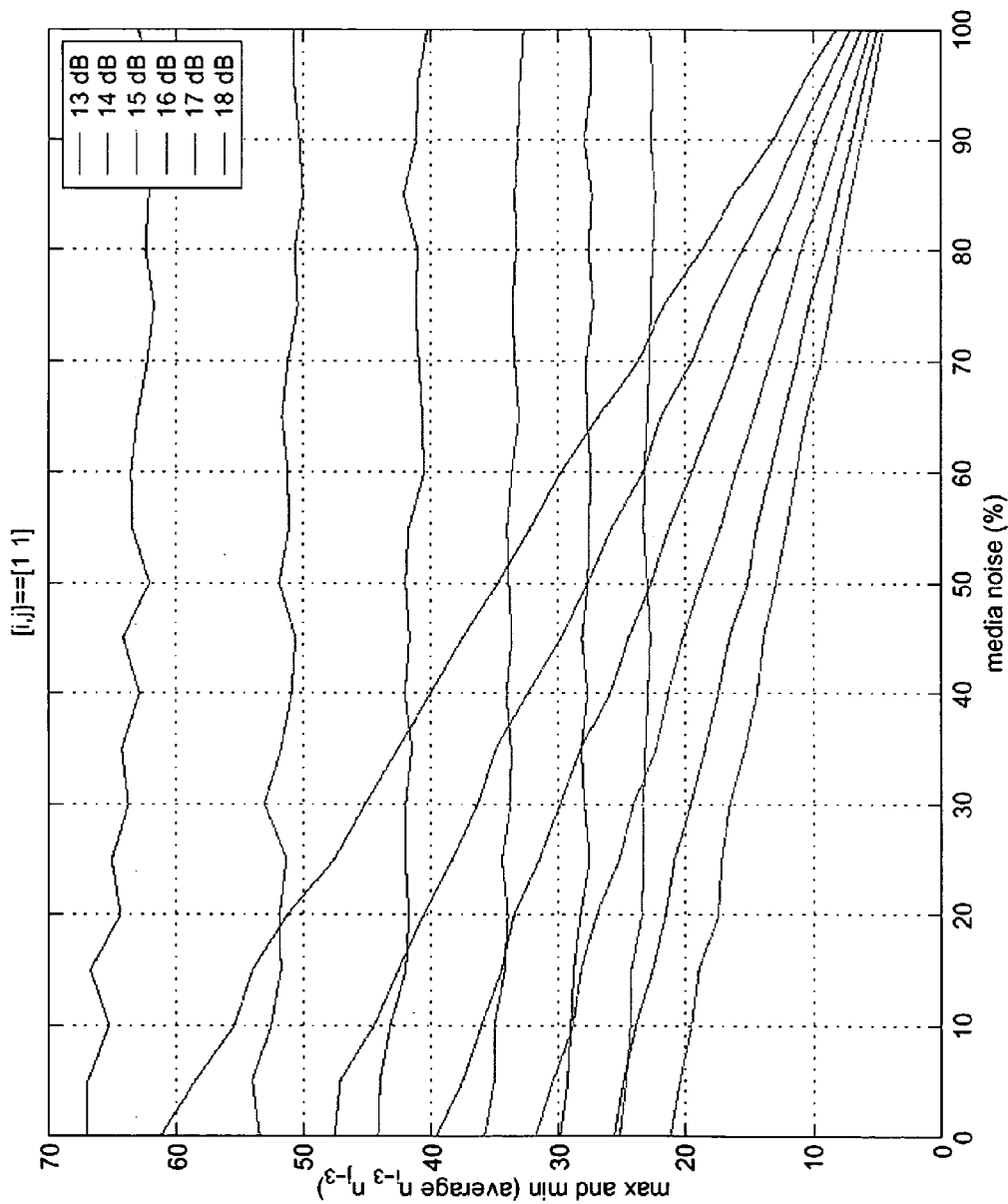
FIGS. 6–11 depicts exemplary graphs showing the magnitude of any expected noise products in simulation of the Viterbi detector of FIG. 2 according to one embodiment.
Figure 7:
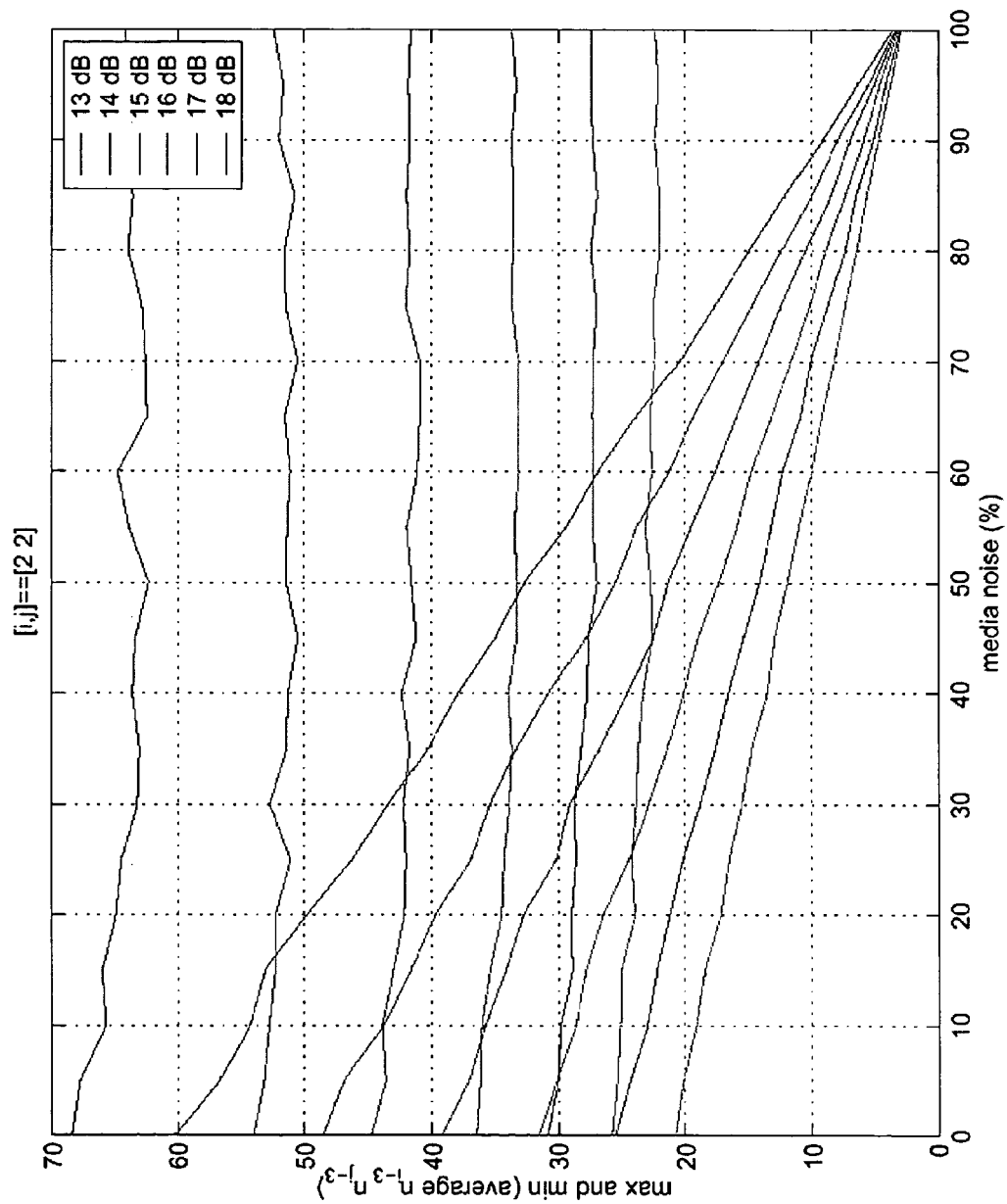
Figure 8:
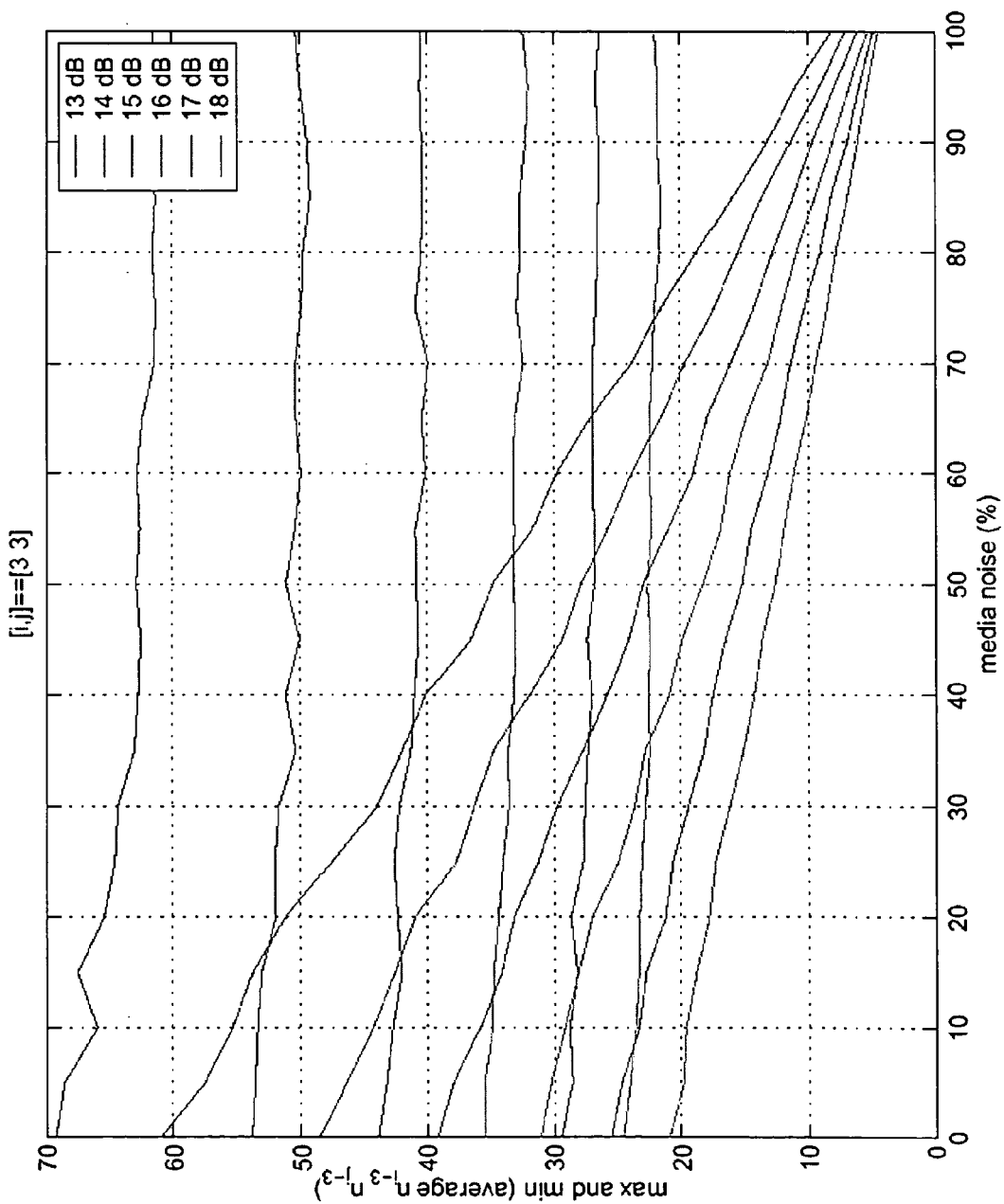

The above method is used to estimate $m_0^2$ from simulations for various combinations of total SNR and media noise share. FIG. 4 graphs the maximum mis-prediction $m_0^2$ over the 32 NRZ hypotheses, as a function of the media noise share for the six SNRS 13, 14, up to 18. FIG. 5 presents the same data as a contour plot.

For small values of the mis-prediction, the expected dB cost $\delta$ of mis-prediction can be approximated by $$\delta = \frac{10 m_0^2}{N \ln 10}. \quad (4)$$

For example, if $m_0^2 = 4$, in order to achieve $\delta = 0.01$, the number of training samples must be approximately $$N = \frac{10 \cdot 4}{0.01 \cdot \ln 10} \approx 1737.$$

Equation 4 shows that the number of training samples N needed to achieve a given expected mis-prediction dB cost target $\delta$ is proportional to the mis-prediction $m_0^2$.

4 Bit Width of Accumulators

This section combines the results of Section 3 estimating the number of noise product samples needed to achieve a given expected mis-prediction cost with simulation estimates of expected noise product magnitudes to calculate necessary bit widths for the six noise product accumulators.

In the previous section, it was calculated that at $m_0^2 = 4$, in order to achieve an expected mis-prediction dB cost of 0.01, approximately N=1737 noise product samples are needed.

At an input SNR of 13 dB, the maximum magnitude of any expected noise product is approximately 68, as is shown in FIGS. 6 through 11 (actually the maximum magnitude is achieved by the expected noise squares). To provide scale, recall that the ideal PR4 equalized signal takes on the three values $\{-32, 0, +32\}$.

Thus, under the pessimistic scenario of $m_0^2 = 4$ and an SNR of 13 dB, we need at least $$1 + \lceil \log_2(68) \rceil + \lceil \log_2(1737) \rceil = 19$$

bits to represent the accumulated square noise. Notice that we took separate ceiling terms for the two factors 68 and 1737 because, almost certainly, the number N of accumulated samples will be a power to two ($2^{11}$ in this case).

This estimate would decrease by 1 bit for every 3 dB increase in SNR.

Figure 9:
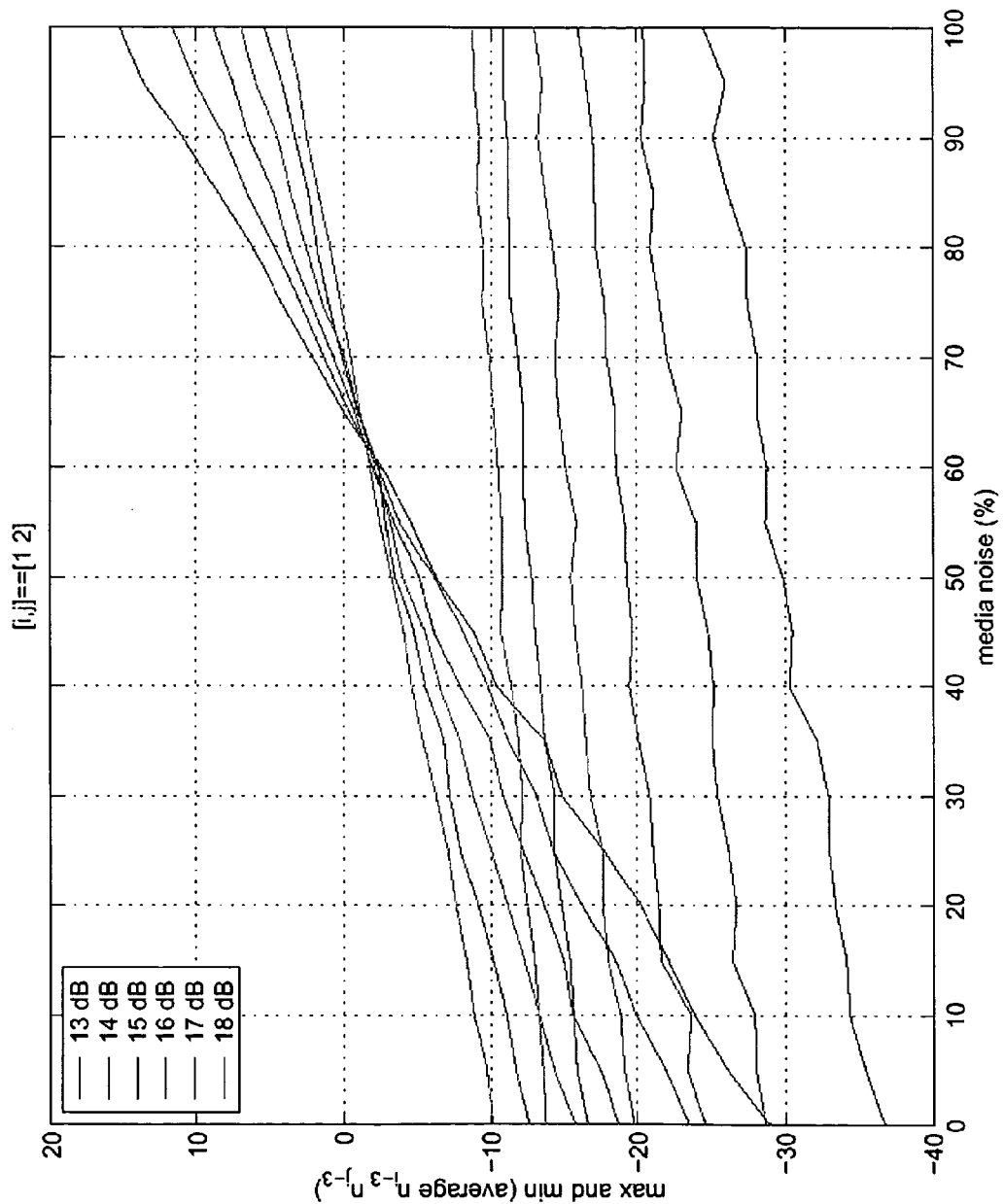
Figure 10:
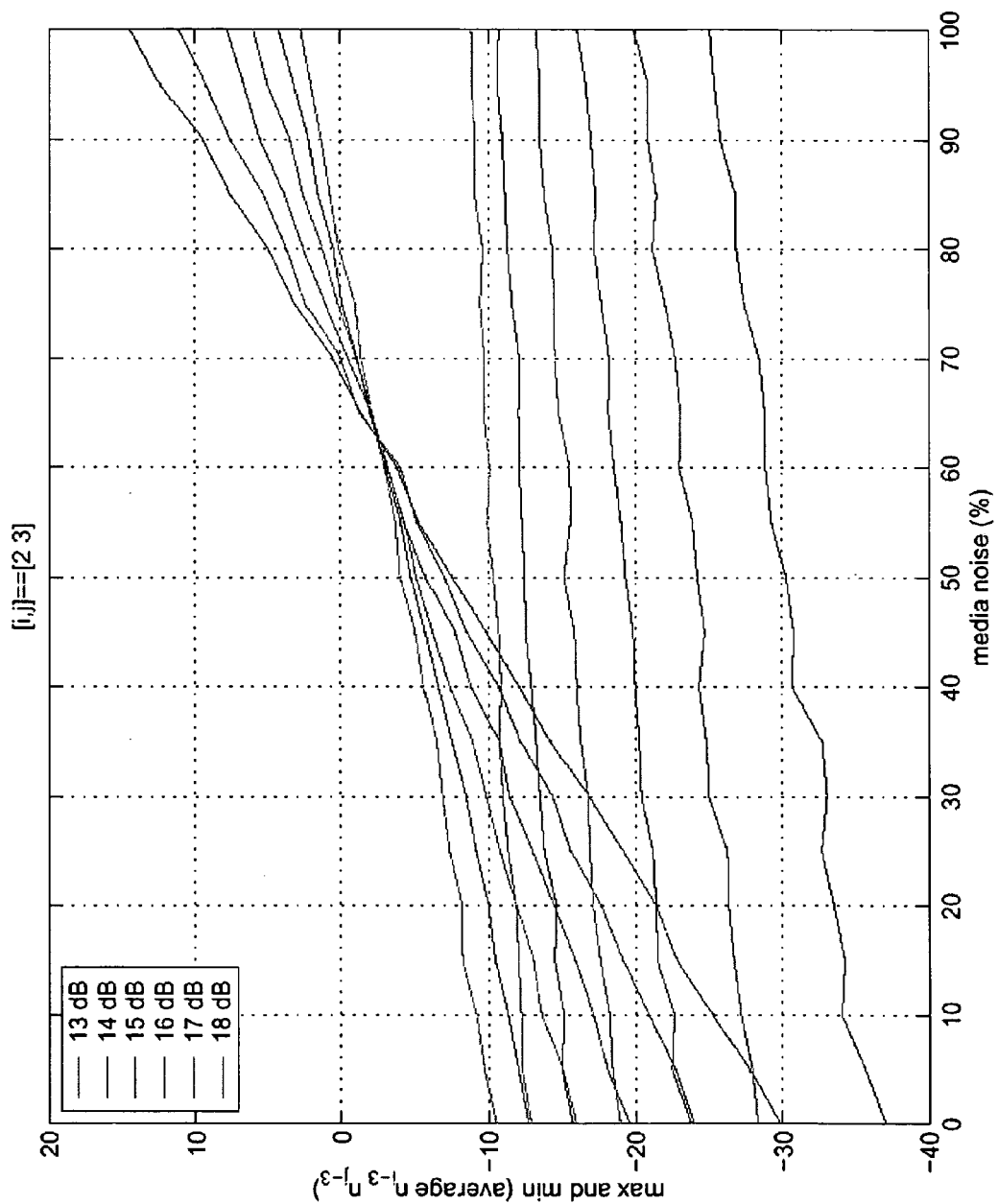
Figure 11:
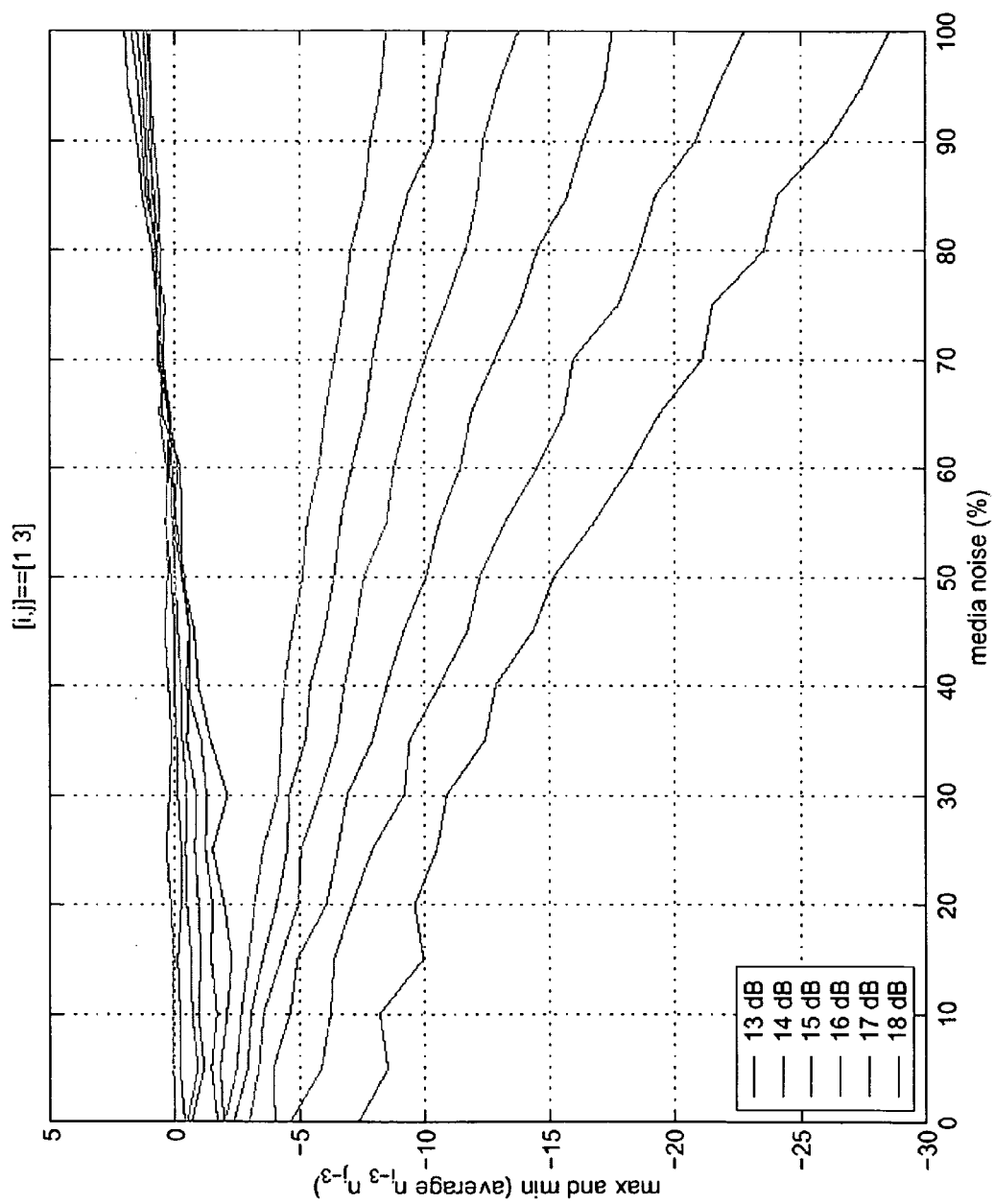

Also, 1 bit could be dropped from accumulators tailored for off-diagonal products as shown in FIGS. 9 through 11.

Bit Width of Noise Bias Accumulators

The (un-squared) noise samples can safely be saturated to the integer range $[-32, 31]$ (where the PR4 signal is normalized to take on the three values $\{-32, 0, 32\}$). Even at 9 dB SNR at the PR4 equalized signal, this gives ±4 standard deviations of play, since the noise variance at this SNR is about 64 least significant bits ("LSBs"). Enough noise samples should be accumulated to push the variance in the mean well below 1 LSB. For this, an accumulator width of 10+6 bits would suffice.

It is recommended that the unrounded accumulation results be available off-chip as input to the off-chip tap calculation algorithm.

5 On-board Calibration Support

Figure 12:
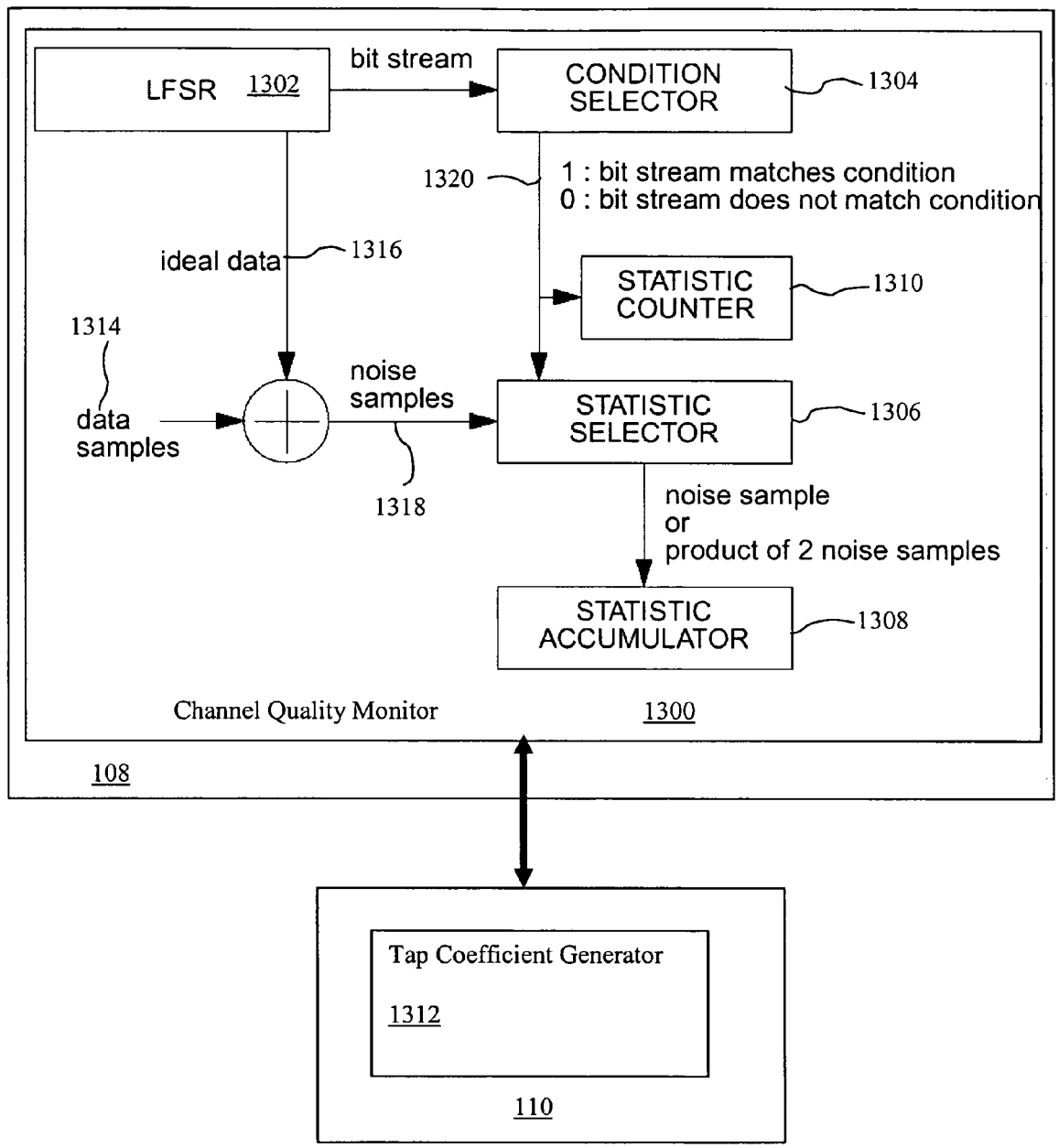
FIG. 12 depicts a block diagram of on-chip hardware for implementing the disclosed calibration algorithm according to one embodiment.

Referring to FIG. 12, the minimal on-board hardware needed to support the calibration algorithm is described. In one embodiment, this hardware is used by a filter tap coefficient generator algorithm 1312 (hardware, software/firmware or a combination thereof) executed by the microcontroller 110 to measure noise statistics and compute the filter coefficients as described above. A critical issue in the calibration algorithm is the alignment between the three noise samples ($n_{i-2}$, $n_{i-1}$, $n_i$) and the condition block of NRZ bits $b_{i-3}b_{i-2}b_{i-1}b_i$ (in the case of q=4) or $b_{i-2}b_{i-1}b_i$ (in the case q=3). As a matter of notation, the NRZ data bits $b_i$, the noise samples $n_i$ the noisy PR4 data samples $r_i$, and the ideal PR4 data samples $\tilde{r}_i$ are indexed so that $r_i = \tilde{r}_i + n_i$ and $\tilde{r}_i = 32(b_i - b_{i-2})$ For each NRZ data condition $c_{-q+1} \ldots c_{-1}c_0$, nine distinct statistics are accumulated: the three noise samples $n_{i-2}$, $n_{i-1}$, $n_i$; and their six possible products $n_{i-2}^2$, $n_{i-2}n_{i-1}$, $n_{i-2}n_i$, $n_{i-1}^2$, $n_{i-1}n_i$, and $n_i^2$; where i is an index at which the NRZ data (the Pseudo Random Bit Sequence ("PRBS") pattern has $b_{i-q+1} \ldots b_{i-1}b_i = c_{-q+1} \ldots c_{-1}c_0$.

An algorithm to do this that employs that least possible on-chip support would accumulate only one of the nine statistics for only one of the $2^q$ data conditions on any one data-read operation. The same written data would be reread $9 \cdot 2^q$ times, each time accumulating one of the nine statistics at one of the $2^q$ NRZ conditions.

To support this scheme, at bare minimum, the following on-chip hardware may be provided for use/control by the micro-controller 110, or other external calibration hardware and/or software, as shown in FIG. 12.

Linear Feedback Shift Register ("LFSR") 1302

An LFSR 1302 is needed to generate the periodic PRBS pattern of NRZ bits synchronized with the read-back data. The PRBS pattern is used in two distinct ways: (1) to generate ideal data values $\tilde{r}_i = 32(b_i - b_{i-2})$ 1316 used to subtract from the ITR 136 output $r_i$ 1314 to leave the noise samples $n_i = r_i - \tilde{r}_i$; 1318 and (2), to drive a 'condition selector' 1304 that zeroes out all samples 1318 feeding the accumulator 1308 except the samples aligned with a given NRZ condition.

Condition Selector 1304

The condition selector 1304 contains a q-bit register $c_{cond}$ to hold any one of the $2^q$ NRZ condition blocks $c_{-q+1} \ldots c_{-1}c_0$. The output of the condition selector 1304 is a single-bit signal 1320 that flags bit cycles i at which the NRZ data pattern matches the NRZ condition block: $b_{i-q+1} \ldots b_{i-1} b_i = c_{-q+1} \ldots c_{-1}c_0$. The flag 1320 is used to enable the addition of a corresponding noise statistic (one of the nine mentioned above) into a 'statistic accumulator' 1308. In one embodiment, the NRZ condition block is read as a static input parameter, and responsibility of cycling through the $2^q$ values is performed by the microcontroller 110.

Statistic Selector 1306

The statistic selector 1306 selects which of the nine noise statistics described above is to be accumulated and performs the required multiplication of two noise samples to generate the product terms of the noise statistics. In one embodiment, the microcontroller 110 cycles through the nine settings.

Statistic Accumulator 1308

The statistic accumulator 1308 is an accumulator wide enough to accommodate the 'biggest' of the nine statistics (see Section 4 above for a calculation of this width). At a minimum, an overflow condition should be flagged and made available to the micro-controller 110. A more flexible 'halt at fill line' scheme would involve a threshold, which would be set to some value below the capacity of the accumulator 1308 (In one embodiment, at ½" of its capacity). When the magnitude of the accumulated result exceeds this value, a process is set in motion to halt the accumulation before overflow occurs. At the same time, a 'statistic counter' 1310 is halted so that the counter's 1310 value records the number of samples that have been accumulated.

Statistic Counter 1310

The statistic counter 1310 counts the number of accumulants that have been summed into the statistic accumulator 1308 for a particular condition and particular statistic. Although the number of condition 'hits' per PRBS period is known a priori, this counter 1310 facilitates reading a partial period, and also enables the 'halt at fill line' accumulation scheme.

The accumulated statistics are then read from the statistic accumulator 1308 along with the count from the statistic counter 1310 and utilized by the micro-controller's 110 tap coefficient generator algorithm 1312 to generate the filter coefficients, as described above.

Adaptive vs. Calibration based training. It will be appreciated that the disclosed embodiments do not utilize an adaptive approach involving a feed back loop, wherein the Viterbi detector output data, together with the delayed Viterbi input data is used to compute noise statistics, which in turn are used to compute the coefficients/parameters of the branch metric functions to be applied in subsequent Viterbi time steps. In contrast, the disclosed embodiments, rather than trying to adapt branch metric functions while reading actual user data, use a dedicated training and calibration process to determine the parameters of the branch metric functions to be used in later READ operations. In particular, as opposed to the parameters of the branch metric functions being updated/changed during a READ operation, the disclosed methods assign the parameters of the branch metric functions prior to any READ operations and these parameters are not updated or changed while user data is being read. Further, in contrast to computing noise statistics using estimates of the written data, in particular, the output data of the Viterbi detector, the disclosed embodiments compute noise statistics based on a known data sequence. In particular a well defined pseudo random data pattern is generated using a Linear Feedback Shift Register ("LFSR") and written to the disc. This data pattern is regenerated using the same LFSR and synchronized to the data samples while reading the previously written sequence. The Viterbi detector is not used/needed at all to determine expected data for the noise statistic computation.

Branch Metric Functions. Known correlation sensitive branch metric functions consist out of a square term and a logarithmic term, where the square term is computed using the filtered differences of data samples and ideal (noise free) samples associated with the respective branch. The output data of such a filter is squared and scaled. Finally the logarithmic term is added to build the metric value. In contrast, the disclosed embodiments separate target and sample processing. In particular, as the disclosed embodiments use a calibration method rather than an adaptive approach, the filter coefficients are defined and constant when a READ operation is started. Therefore, it is possible to compute the targets in advance as part of the calibration process, where target refers to the filtered ideal samples. This way, only the data samples need to be passed through a filter while the pre-computed target is subtracted from the filter output and the number of real time difference operations can be reduced by n-1, where n is the number of filter taps. Furthermore, this structure supports filter sharing. With regards to noise bias compensation, the mean of the noise samples might be non-zero and depending on the data pattern, thereby imposing a data dependent bias. The disclosed embodiments correct for this bias by subtracting the filtered noise means from the filtered data samples (See FIG. 5). Again, it is not required to actually implement a filter for real time processing, since the filtered noise means can be computed in advance as part of the calibration-process. Further, the branch metric functions of the disclosed embodiments do not contain any additive logarithmic term.

Reduced Order/Complexity. Prior methods required a separate filter to be implemented for each branch metric. The disclosed embodiments introduce the concept of condition masks to provide a concise method to reduce the number of filters required for real time branch metric computation by trading performance against hardware complexity. The number of distinct filters can be further reduced by a factor of two by collapsing the pairs of conditions having opposite polarity. The concept of condition masks cannot be applied to prior adaptive methods, described above. If the branch metric parameters, in particular the filter coefficients, keep changing during the READ operation, it is not possible to share a filter, since the ideal samples associated with distinct branches are different and the respective targets are to be computed at the same time in parallel thereby requiring as many implementations of the filter as there are branches sharing the same filter coefficients. Further, prior methods did not disclose the concept of collapsing pairs of conditions having opposite polarity.

It is therefore intended that the foregoing detailed description be regarded as illustrative rather than limiting, and that it be understood that it is the following claims, including all equivalents, that are intended to define the spirit and scope of this invention.

We claim:

1. A method of calibrating a Viterbi detector, said Viterbi detector comprising at least one noise predictive filter, said method comprising:
 (a) obtaining noise samples in a training phase;
 (b) averaging said noise samples;
 (c) estimating entries of a conditional noise matrix; and
 (d) calculating at least one tap of said at least one noise predictive filter based on said estimated entries and configuring said at least one noise predictive filter based on said at least one tap.

2. The method of claim 1, further comprising:
 (e) increasing an amount of said noise samples obtained to increase accuracy of said at least one noise predictive filter.

3. The method of claim 1, further comprising:
 (e) determining an expected mis-prediction cost;
 (f) estimating an amount of training samples required to achieve said expected mis-prediction cost;
 (g) estimating an expected noise product magnitude;
 (h) calculating a bit width of a noise product accumulator based on said expected noise product magnitude;
 (i) generating a pseudo random bit sequence ("PRBS") of non-return-to-zero ("NRZ") bits synchronized with said noise samples;
 (j) matching said PRBS with a NRZ condition block;
 (k) accumulating said matching of said PRBS into said noise product accumulator; and
 (l) counting how many of said matching of said PRBS are accumulated.

4. The method of claim 1, wherein the conditional noise matrix comprises a 3-by-3 conditional noise matrix $C^{[k]}$ defined by $C_{ij}^{[k]}=E(n_{i-3}n_{j-3}|NRZ$ condition k).

5. The method of claim 1 wherein the Viterbi detector is operative to derive a digital representation of an unknown digital data stream from a first digital data stream generated from an analog data stream obtained from an analog medium having a first analog representation of the unknown digital data stream imparted therein, the first digital data stream including first noise data, at least a portion of the first noise data being correlated with at least a portion of the unknown digital data stream, and further wherein:
 the obtaining further comprises:
  imparting a first known digital data stream in a second analog representation within the analog medium; and
  generating a second digital data stream from the analog data stream obtained from the analog medium based on the second analog representation, the second digital data stream being characterized by second noise data, at least a portion of the second noise data being dependent upon at least a portion of the first known digital data stream;
 the estimating further comprises:
  comparing at least a portion of the first known digital data stream with at least a portion of the second digital data stream so as to determine a first correlation between the portion of the second noise data and the portion of the first known digital data stream; and
 the calculating further comprising:
  configuring the at least one noise predictive filter based on the first correlation, the filter, so configured, being operative to substantially remove at least the portion of the first noise data from the first digital data stream prior to the derivation of the digital representation of the unknown data stream.

6. The method of claim 5 further comprising:
 computing a branch metric for each of a plurality of states of a trellis data structure based on the first digital data stream, wherein the at least one noise predictive filter is operative to substantially remove at least the portion of the first noise data from the first digital data stream prior to the computing of the branch metrics.

7. The method of claim 5 wherein the configuring further comprises configuring the at least one noise predictive filter prior to the derivation.

8. The method of claim 5 wherein the configuring further comprises configuring the at least one noise predictive filter substantially coincident with the derivation.

9. The method of claim 5 wherein the unknown data stream is characterized by variability, the first noise data being characterized by variability having a correlation to the variability in the unknown data stream.

10. An apparatus for calibrating a Viterbi detector comprising at least one noise predictive filter, said apparatus comprising:
 a tap generator operative to generate at least one tap coefficient for said at least one noise predictive filter based on data samples obtained during off line training, said tap coefficient representative of a noise correlation estimate;

said tap generator further comprising a tap calculator operative to compute said at least one tap coefficient based on a conditional noise matrix; and a filter configurator coupled with the tap generator and operative to configure that at least one noise predictive filter based on said at least one tap coefficient.

11. The apparatus of claim 10, further comprising:

a noise sampler operative to obtain said data samples;

a linear feedback shift register ("LFSR") operative to generate a periodic pseudo random bit sequence ("PRBS") of non-return to zero ("NRZ") bits synchronized with said data samples;

a condition selector coupled with said noise sampler and said LFSR and operative to select one of said data samples which matches said PRBS NRZ bits;

a statistic accumulator coupled with said noise sampler and said condition selector and operative to receive and accumulate said selected one of said data samples;

a statistic selector coupled with said condition selector and said statistic accumulator and operative to enable said selected data sample to be accumulated by said statistic accumulator;

a statistic counter coupled with said statistic accumulator and operative to count a number of said one of said data samples accumulated; and wherein said tap calculator further bases said at least one tap coefficient computation on said accumulated of said one of said data samples.

12. The apparatus of claim 10 wherein the conditional noise matrix comprises a 3-by-3 conditional noise matrix $C^{[k]}$ defined by $C_{ij}^{[k]}=E(n_{i-3}n_{j-3}|NRZ \text{ condition } k)$.

13. The apparatus of claim 10 wherein the Viterbi detector is operative to derive a digital representation of an unknown digital data stream from a first digital data stream generated from an analog data stream obtained from an analog medium having a first analog representation of the unknown digital data stream imparted therein, the first digital data stream including first noise data, at least a portion of the first noise data being correlated with at least a portion of the unknown digital data stream, and further wherein the tap generator is further operative to:

impart a first known digital data stream in a second analog representation within the analog medium;

generate a second digital data stream from the analog data stream obtained from the analog medium based on the second analog representation, the second digital data stream being characterized by second noise data, at least a portion of the second noise data being dependent upon at least a portion of the first known digital data stream;

compare at least a portion of the first known digital data stream with at least a portion of the second digital data stream so as to determine a first correlation between the portion of the second noise data and the portion of the first known digital data stream; and configure the at least one noise predictive filter based on the first correlation, the filter, so configured, being operative to substantially remove at least the portion of the first noise data from the first digital data stream prior to the derivation of the digital representation of the unknown data stream.

14. The apparatus of claim 13 wherein the tap generator is further operative to compute a branch metric for each of a plurality of states of a trellis data structure based on the first digital data stream, wherein the at least one noise predictive filter is operative to substantially remove at least the portion of the first noise data from the first digital data stream prior to the computing of the branch metrics.

15. The apparatus of claim 13 wherein the tap generator is further operative to configure the at least one noise predictive filter prior to the derivation.

16. The apparatus of claim 13 wherein the configuring further comprises configuring the at least one noise predictive filter substantially coincident with the derivation.

17. The apparatus of claim 13 wherein the unknown data stream is characterized by variability, the first noise data being characterized by variability having a correlation to the variability in the unknown data stream.

18. An apparatus for calibrating a Viterbi detector, said Viterbi detector comprising at least one noise predictive filter, said apparatus comprising:

means for obtaining noise samples in a training phase;

means for averaging said noise samples;

means for estimating entries of a conditional noise matrix;

means for calculating at least one tap of said at least one noise predictive filter based on said estimated; and means for configuring said at least one noise predictive filter based on said at least one tap.

19. The apparatus of claim 18, wherein the conditional noise matrix comprises a 3-by-3 conditional noise matrix $C^{[k]}$ defined by $C_{ij}^{[k]}=E(n_{i-3}n_{j-3}|NRZ \text{ condition } k)$.

20. The apparatus of claim 18 wherein the Viterbi detector is operative to derive a digital representation of an unknown digital data stream from a first digital data stream generated from an analog data stream obtained from an analog medium having a first analog representation of the unknown digital data stream imparted therein, the first digital data stream including first noise data, at least a portion of the first noise data being correlated with at least a portion of the unknown digital data stream, and further wherein:

the means for obtaining further comprises:

means for imparting a first known digital data stream in a second analog representation within the analog medium; and means for generating a second digital data stream from the analog data stream obtained from the analog medium based on the second analog representation, the second digital data stream being characterized by second noise data, at least a portion of the second noise data being dependent upon at least a portion of the first known digital data stream;

the means for estimating further comprising:

means for comparing at least a portion of the first known digital data stream with at least a portion of the second digital data stream so as to determine a first correlation between the portion of the second noise data and the portion of the first known digital data stream; and the means for calculating further comprising:

means for configuring the at least one noise predictive filter based on the first correlation, the filter, so configured, being operative to substantially remove at least the portion of the first noise data from the first digital data stream prior to the derivation of the digital representation of the unknown data stream.

* * * * *

UNITED STATES PATENT AND TRADEMARK OFFICE
CERTIFICATE OF CORRECTION

PATENT NO. : 7,191,083 B2
APPLICATION NO. : 11/490981
DATED : March 13, 2007
INVENTOR(S) : Jonathan J. Ashley et al.

It is certified that error appears in the above-identified patent and that said Letters Patent is hereby corrected as shown below:

In the Claims

Columns 15-16, in claim 3, line 2, before "determining" delete "(e)" and substitute --(f)-- in its place.

Columns 15-16, in claim 3, line 3, before "estimating" delete "(f)" and substitute --(g)-- in its place.

Columns 15-16, in claim 3, line 5, before "estimating" delete "(g)" and substitute --(h)-- in its place.

Columns 15-16, in claim 3, line 6, before "calculating" delete "(h)" and substitute --(i)-- in its place.

Columns 15-16, in claim 3, line 8, before "generating" delete "(i)" and substitute --(j)-- in its place.

Columns 15-16, in claim 3, line 11, before "matching" delete "(j)" and substitute --(k)-- in its place.

Columns 15-16, in claim 3, line 12, before "accumulating" delete "(k)" and substitute --(1)-- in its place.

Columns 15-16, in claim 3, line 14, before "matching" delete "(l)" and substitute --(m)-- in its place.

Column 16, in claim 4, line 3, after "condition" delete "k)" and substitute --$k$)-- in its place.

Column 17, in claim 12, line 3, after "condition" delete "k)" and substitute --$k$)-- in its place.

Column 18, in claim 18, line 8, delete "estimated;" and substitute --estimated entries;-- in its place.

UNITED STATES PATENT AND TRADEMARK OFFICE
CERTIFICATE OF CORRECTION

PATENT NO. : 7,191,083 B2
APPLICATION NO. : 11/490981
DATED : March 13, 2007
INVENTOR(S) : Jonathan J. Ashley et al.

It is certified that error appears in the above-identified patent and that said Letters Patent is hereby corrected as shown below:

In the Claims (cont'd)
 Column 18, in claim 19, line 3, after "condition" delete "k)" and substitute --*k*)-- in its place.

Signed and Sealed this

Twenty-ninth Day of May, 2007

JON W. DUDAS
*Director of the United States Patent and Trademark Office*